(12) United States Patent
Storaska et al.

(10) Patent No.: US 7,871,529 B2
(45) Date of Patent: Jan. 18, 2011

(54) SYSTEM FOR FABRICATING NANOCOILS USING A WET ETCH TECHNIQUE

(75) Inventors: Garrett A. Storaska, Reston, VA (US); Robert S. Howell, Wheaton, MD (US)

(73) Assignee: Northrop Grumman Systems Corporation, Los Angeles, CA (US)

(*) Notice: Subject to any disclaimer, the term of this patent is extended or adjusted under 35 U.S.C. 154(b) by 0 days.

(21) Appl. No.: 12/693,875

(22) Filed: Jan. 26, 2010

(65) Prior Publication Data

US 2010/0224957 A1 Sep. 9, 2010

Related U.S. Application Data

(63) Continuation of application No. 11/524,245, filed on Sep. 21, 2006, now Pat. No. 7,710,235.

(60) Provisional application No. 60/719,590, filed on Sep. 23, 2005.

(51) Int. Cl.
*H01L 27/08* (2006.01)

(52) U.S. Cl. .................. 216/2; 257/531; 257/E27.046; 385/18; 359/224.1

(58) Field of Classification Search ..................... 216/2; 257/531, E27.046; 385/18; 359/224.1
See application file for complete search history.

(56) References Cited

U.S. PATENT DOCUMENTS

| 6,498,557 | B2 * | 12/2002 | Johnson ...................... 336/200 |
| 7,514,301 | B2 * | 4/2009 | Storaska et al. ............. 438/149 |
| 7,601,620 | B2 * | 10/2009 | Storaska et al. ............. 438/517 |
| 7,710,235 | B2 * | 5/2010 | Storaska et al. ............. 336/225 |

\* cited by examiner

*Primary Examiner*—Daniel Petkovsek
(74) *Attorney, Agent, or Firm*—Andrews Kurth LLP

(57) ABSTRACT

Novel applications of nanocoil technology and novel methods of fabricating nanocoils for use in such applications and others. Such applications include microscopic electro-mechanical systems (MEMS) devices including nanocoil mirrors, nanocoil actuators and nanocoil antenna arrays. Inductors or traveling wave tubes fabricated from nanocoils are also included. A method for fabricating nanocoils with a desired pitch includes determining a desired pitch for fabricated nanocoil, selecting coiling arm orientation in which coiling arm orientation is arm angle between coiling arm an crystalline orientation of underlying substrate, whereby coiling arm orientation affects pitch of fabricated nanocoil, patterning coiling arm structure with selected coiling arm orientation, and, releasing coiling arm, whereby fabricated nanocoil is formed.

10 Claims, 23 Drawing Sheets

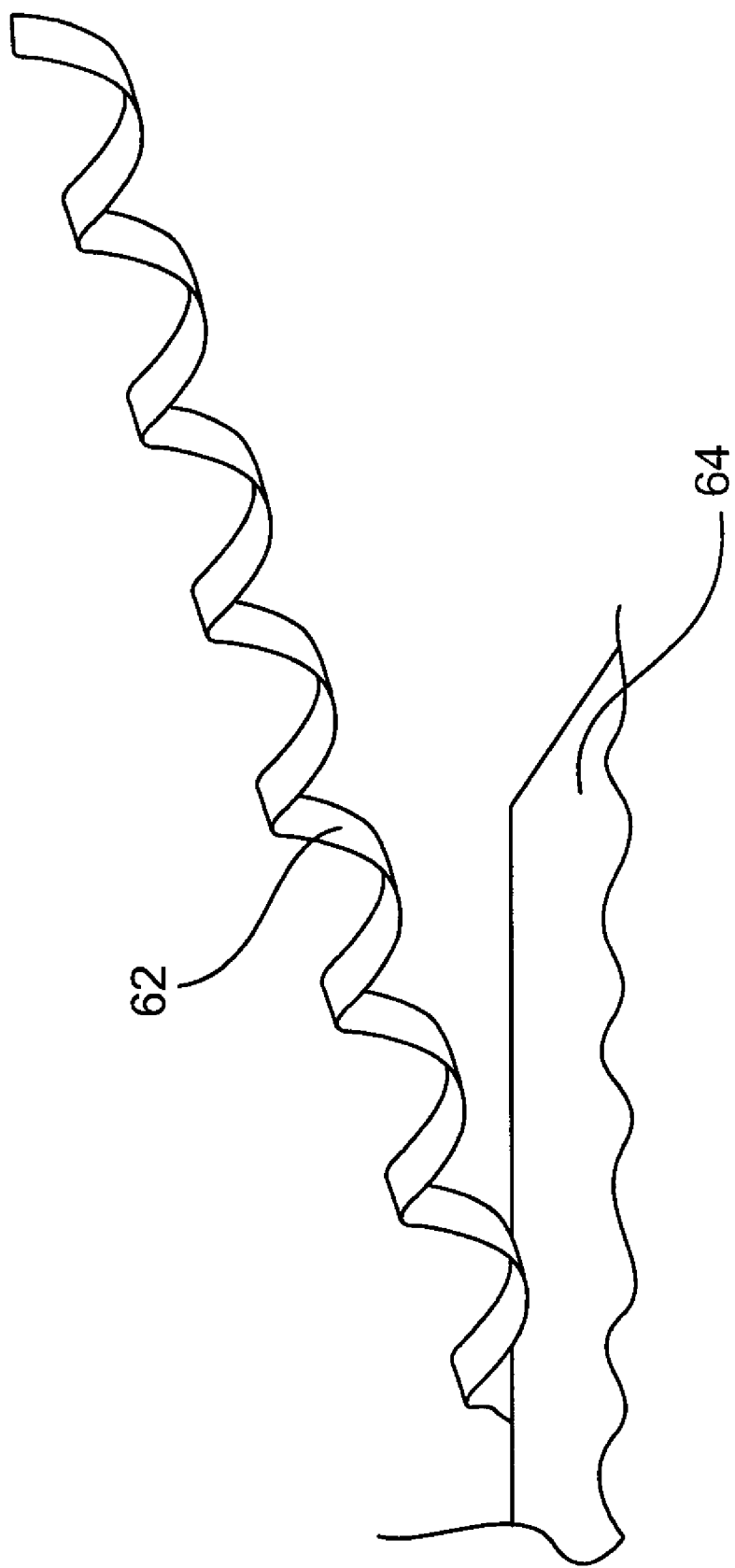

SYSTEM FOR FABRICATING NANOCOILS USING A WET ETCH TECHNIQUE

CROSS-REFERENCE TO RELATED APPLICATIONS

This application is a continuation of and claims the priority of co-pending U.S. patent application Ser. No. 11/524,245, entitled "Inductors Fabricated From Spiral Nanocoils and Fabricated Using Nanocoil Spiral Pitch Control Techniques," filed Sep. 21, 2006, which is hereby incorporated by reference and which claims priority of provisional application No. 60/719,590, entitled "Microscopic Electro-Mechanical Systems, Radio Frequency Devices Utilizing Nanocoils and Spiral Pitch Control Techniques For The Same," filed Sep. 23, 2005, which is hereby incorporated by reference in its entirety. This application is also related to U.S. patent application Ser. No. 11/524,246, now U.S. Pat. No. 7,514,301, entitled "Method For Fabricating Nanocoils," filed herewith on Sep. 21, 2006 and U.S. patent application, Ser. No. 11/524,244, now U.S. Pat. No. 7,601,620, entitled "Improved Nanocoils, Systems and Methods For Fabricating Nanocoils," filed herewith on Sep. 21, 2006, both of which are hereby incorporated by reference in their entirety.

BACKGROUND

Nanocoils are coiled circuits, including memory devices and other circuits. Nanocoils have great potential for super dense memory and power FET applications due to nanocoils' enormous surface storage and periphery area to volume ratio. Previously, a 100X improvement over planar memory has been experimentally realized by using stress ridges to force concentric coiling on polycrystalline Si Coil.

Conventional technologies in the areas of microscopic electro-mechanical systems ("MEMS") electrostatic switches and radio-frequency ("RF") devices may similarly be improved. As with improvement shown over planar memory, conventional MEMS electrostatic switch and RF device technologies may be drastically improved upon.

The are a number of current techniques for fabricating nanocoils. However, as the number of applications of nanocoils increases, improved fabrication techniques are sought. Controlling the coiling of nanocoils provides a number of advantages. Controlling the coiling of nanocoils enables greater control over the resulting nanocoils and fabrication of nanocoils that are a better fit for their desired application.

SUMMARY

An advantage of the embodiments described herein is that they overcome the disadvantages of the prior art.

These advantages and others are achieved by a microscopic electro-mechanical systems (MEMS) micro-mirror array. The MEMS micro-mirror array includes one or more nanocoil mirrors and a substrate on which the one or more nanocoil mirrors are situated, including a voltage supply for providing a voltage to the one or more nanocoil mirrors. The one or more nanocoil mirrors coil in an off position when the voltage supply is off, thereby reflecting any incident light away from a target, and the one or more nanocoil mirrors lay substantially flat on substrate in an on position when the voltage supply is on, thereby reflecting any incident light towards target.

These advantages and others are also achieved by a tunable, variable antenna. The antenna includes an array of one or more nanocoil arms configured as antennas for receiving signals, the one or more nanocoil arms comprising a nanocoil that may be uncoiled at varying lengths depending on an amount of supplied voltage and a voltage supply for supplying supplied voltage to one or more nanocoil arms to vary the length of one or more nanocoil arms and wavelength of signals receivable by antenna. The length of one or more nanocoil arms determines wavelength of signals receivable by antenna.

These advantages and others are also achieved by an inductor including a spiral nanocoil tube with a plurality of spiral coils adjacent to each other. The spiral coils have a substantially constant pitch and the spiral nanocoil tube defines a air core. The spiral nanocoil tube is fabricated from material providing inductance when a current is applied to the spiral nanocoil tube.

These advantages and others are also achieved by a method for fabricating nanocoils with a desired pitch. The method includes determining a desired pitch for fabricated nanocoil, selecting a coiling arm orientation, patterning the coiling arm structure with the selected coiling arm orientation, and releasing the coiling arm, whereby the fabricated nanocoil is formed. The coiling arm orientation is arm angle between the coiling arm an crystalline orientation of underlying substrate, whereby the coiling arm orientation affects pitch of fabricated nanocoil.

DESCRIPTION OF THE DRAWINGS

The detailed description will refer to the following drawings, wherein like numerals refer to like elements, and wherein:

FIGS. 5A-5C are electron microscope views of single crystal silicon and nanocoils fabricated therefore illustrating affects of orientation on nanocoil pitch.

DETAILED DESCRIPTION

Described herein are novel applications of nanocoil technology and novel methods of fabricating nanocoils for use in such applications and others. Embodiments described herein include both MEMS devices fabricated with nanocoils and RF devices fabricated with nanocoils. Controlling the coiling of the nanocoils, including the orientation and coil width, enables better control of resultant nanocoils and produces nanocoils that better fit the desired application. Accordingly, described herein are methods of fabricating nanocoils incorporating techniques for controlling the spiral pitch of the nanocoils.

Nanocoils have been previously described in U.S. Provisional application No. 60/476,200, filed on Jun. 6, 2003 ("the '200 application"), U.S. Provisional application No. 60/532,175, filed on Dec. 24, 2003 ("the '175 application"), and U.S. patent application Ser. No. 10/861,885 ("the '885 application"), filed on Jun. 7, 2004 (published as US 2005/0013151), each of which are incorporated herein by reference in their entirety. These applications describe both nanocoils and methods of fabricating nanocoils. Nanocoils utilized in the applications described herein may be fabricated as described in these applications or as otherwise described herein.

Figure 1:
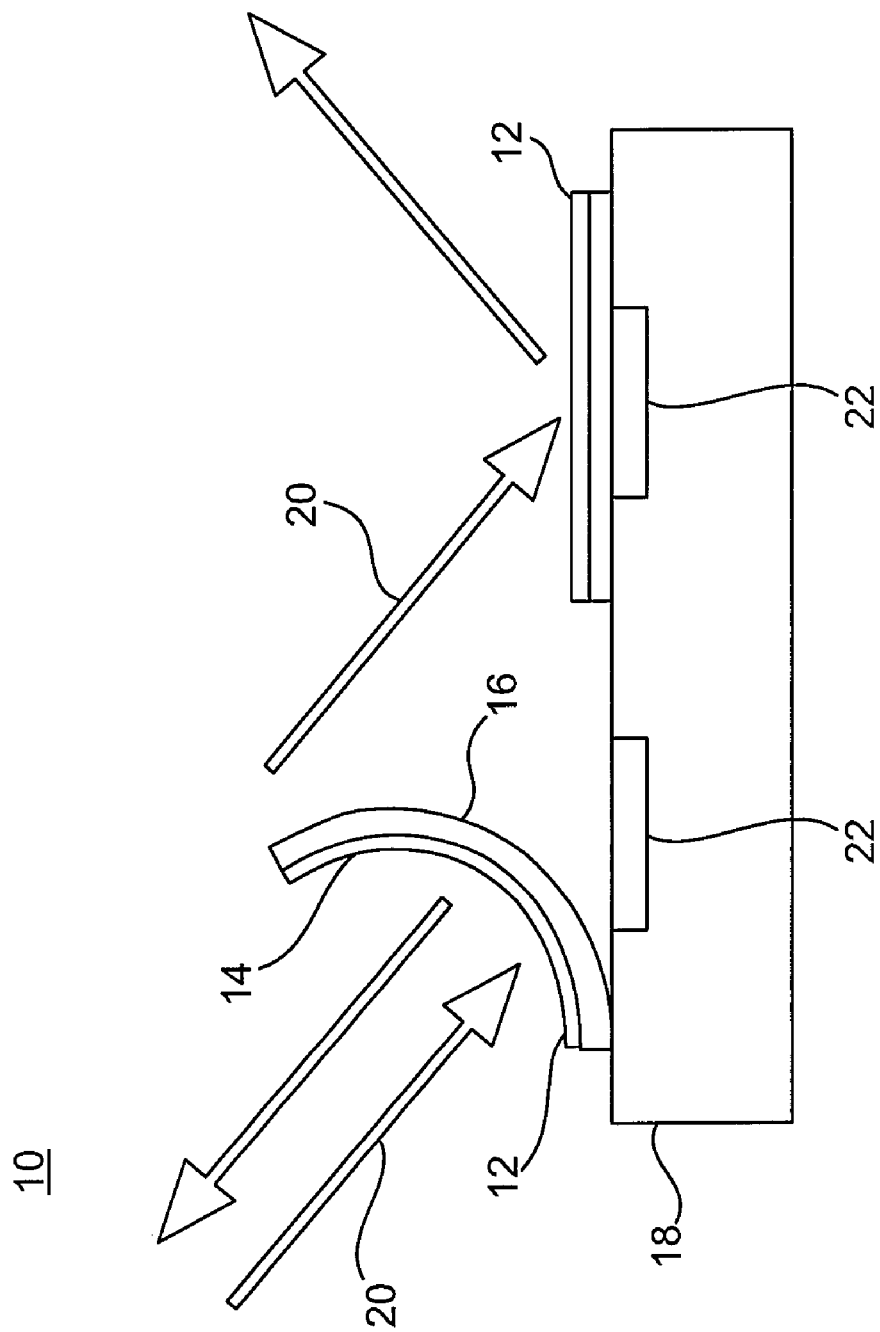
FIG. 1 is a block diagram illustrating an embodiment of a MEMS micro-mirror array fabricated with nanocoils.

With reference now to FIG. 1, shown is an embodiment of a MEMS micro-mirror array 10 fabricated with nanocoils. MEMS micro-mirror array 10 is square, high-packing density, deformable array of nanocoil mirrors 12. The embodiment illustrated comprises 5 µm square nanocoil mirrors 12, although MEMS micro-mirror arrays 10 with different size nanocoils 12 may be fabricated. Nanocoil mirrors 12 are nanocoils fabricated with reflective material on nanocoil top surface. In the embodiment shown, each micro-minor in MEMS micro-mirror array 10 utilizes a quarter-turn nanocoil 12 structure with a sputtered Al or Au mirrored top surface 14 and a bottom side electrode 16. Substrate 18 on which nanocoils rest include electrode 22 or other voltage source to supply voltage to electrode 16 and, thereby, nanocoil mirrors 12. Nanocoil 12 may be fabricated from silicon nitride/silicon ($Si_2Ni_4$/Si), where the $Si_3Ni_4$ is a stressed nitride coiling layer. A mirror material (e.g., Al or Au) may be sputtered onto nanocoil 12 structure prior to coiling to provide mirrored top surface 14. A SOI (silicon-on-insulator) wafer may be used to provide the silicon layer and a sacrificial layer (e.g., a buried-oxide layer (BOX) (e.g., $SiO_2$)) that is removed to release the nanocoil. Other types of sacrificial layers may be used.

In an OFF state, with no voltage applied to electrode 16, nanocoil mirror 12 bends upwards away from substrate 18 due to an internal bi-layer stress state (between Al or Au mirrored top surface 14 layer and bottom side electrode 16 layer) and prevents any incident light 20 from propagating to a projector lens (not shown). To turn a nanocoil mirror 12 ON, a voltage may be applied to electrode 22 under nanocoil mirror 12, which pulls nanocoil mirror 12 flat electrostatically, allows nanocoil mirror 12 to reflect all incident light 20 to the projector lens.

With continued reference to FIG. 1, utilizing nanocoils 12 as mirrors in MEMS micro-mirror array 10 as shown will enable an array of addressable micro-mirrors to be produced with almost 100% packing density since the deformability of nanocoil mirror 12 eliminates the need for an area reducing hinge or via used in commercial micro-mirrors. The embodiment shown allows the fabrication of efficient MEMS micro-mirror arrays 10 with tiny 5 µm square deformable nanocoil mirrors 12 compatible with high contrast portable projection displays, like that required for a Pen Projector Display (see U.S. patent application Ser. No. 10/879,040, entitled "Side Spring Micro-Mirror" and filed Jun. 30, 2004, which is hereby incorporated by reference).

Figure 2:
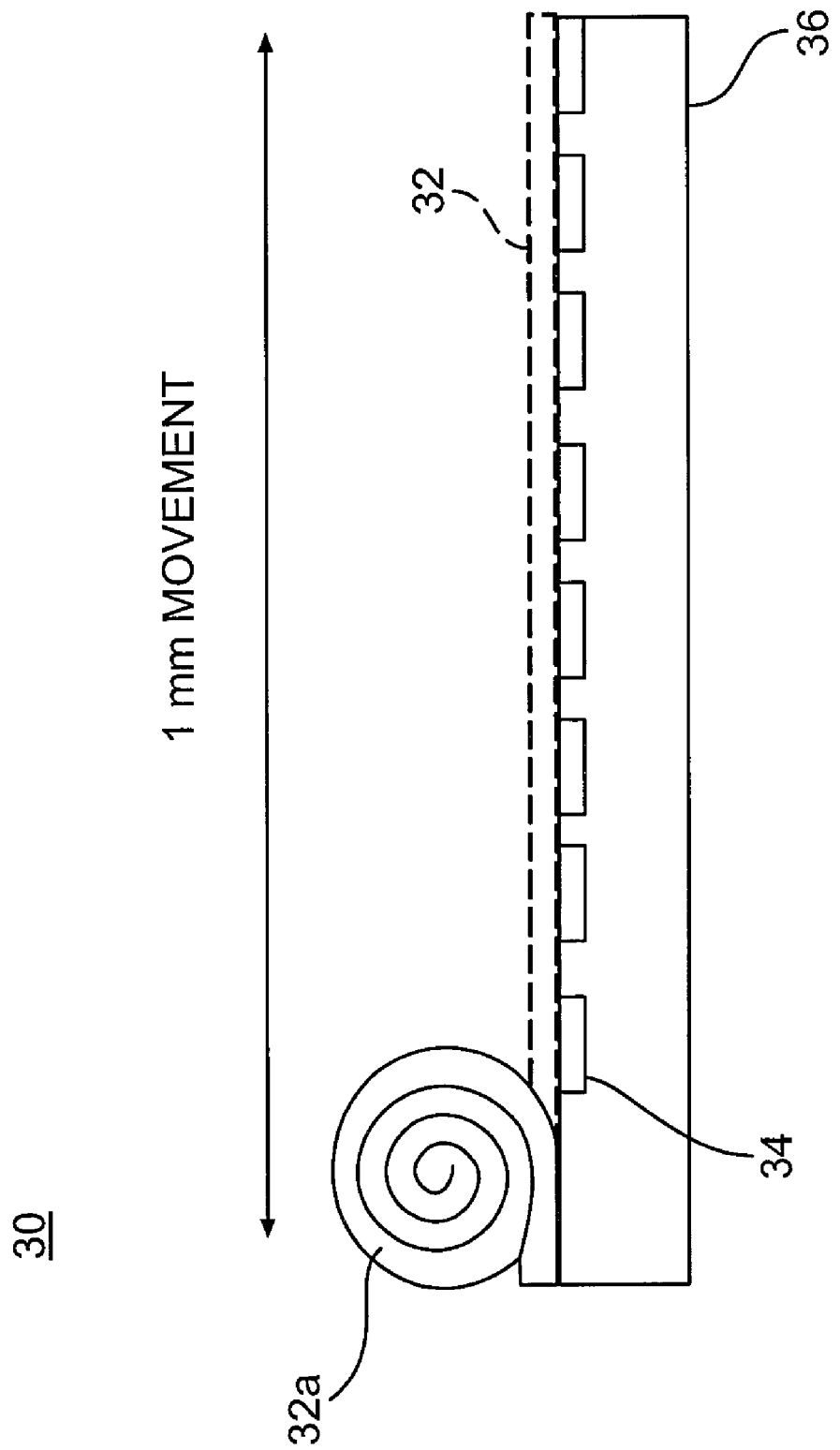
FIG. 2 is a block diagram illustrating an embodiment of a MEMS actuator fabricated with nanocoils.

With reference now to FIG. 2, shown is an embodiment of a large-scale deflecting MEMS actuator 30 fabricated with nanocoil 32a. Unlike current MEMS devices which typically deflect a few microns with the application of a reasonable pull down voltage (5-20V depending on application), nanocoil 32a can deflect on a macroscopic scale, e.g., ~1000 µm with the application of small pull down voltages (e.g., +/−2V). When such a small pull down voltage is applied, e.g., via electrodes 34, nanocoil 32a uncoils, laying flat over electrodes 34 on substrate 36 (as shown by nanocoil 32b). This large deflection is achieved because the coiled geometry of nanocoil 32a permits electrodes 34 on substrate 36 to always remain in close proximity to nanocoil 32a while nanocoil 32a is uncoiling. Since electrostatic force is dependent on the square of the separation distance between nanocoil 32a and electrodes 34 and the separation distance remains small, a small voltage provides a large driving force for uncoiling nanocoil 32a. Furthermore, by zeroing the voltage of electrodes 34, nanocoil 32b will snap back to the original, coiled shape shown due to the stored elastic restoring force inherent in nanocoil 32a. FIG. 2 shows nanocoil 32a fully coiled, with large-scale deflecting MEMS actuator 30 in OFF position (electrode 34 voltage zeroed) and nanocoil 32b in fully uncoiled position, with large-scale deflecting MEMS actuator 30 in ON position. Nanocoil 32a may be fabricated from silicon nitride/silicon ($Si_2Ni_4$/Si), where the $Si_3Ni_4$ is a stressed nitride coiling layer. A SOI (silicon-on-insulator) wafer may be used to provide the silicon layer and a buried-oxide layer (BOX) (e.g., $SiO_2$) that is removed to release the nanocoil.

Figure 3B:
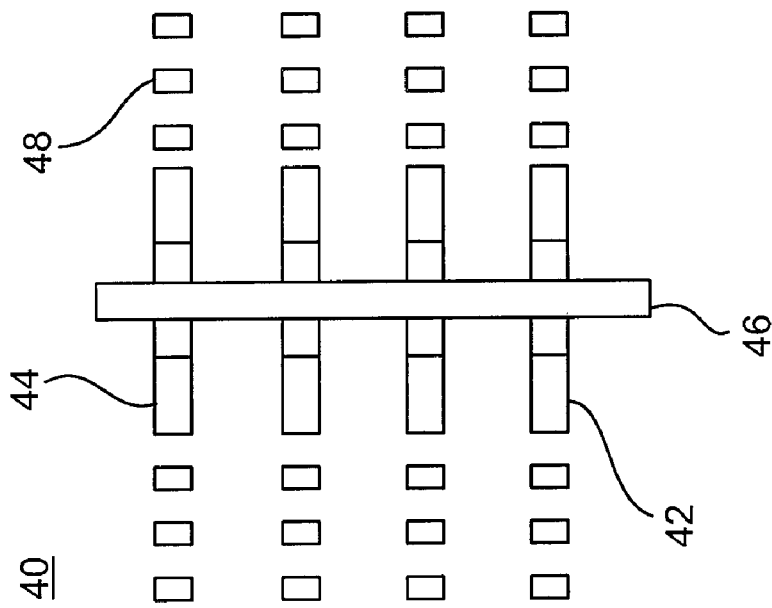
FIGS. 3A-3B are block diagrams illustrating an embodiment of a tunable antenna fabricated with nanocoils.
Figure 3A:
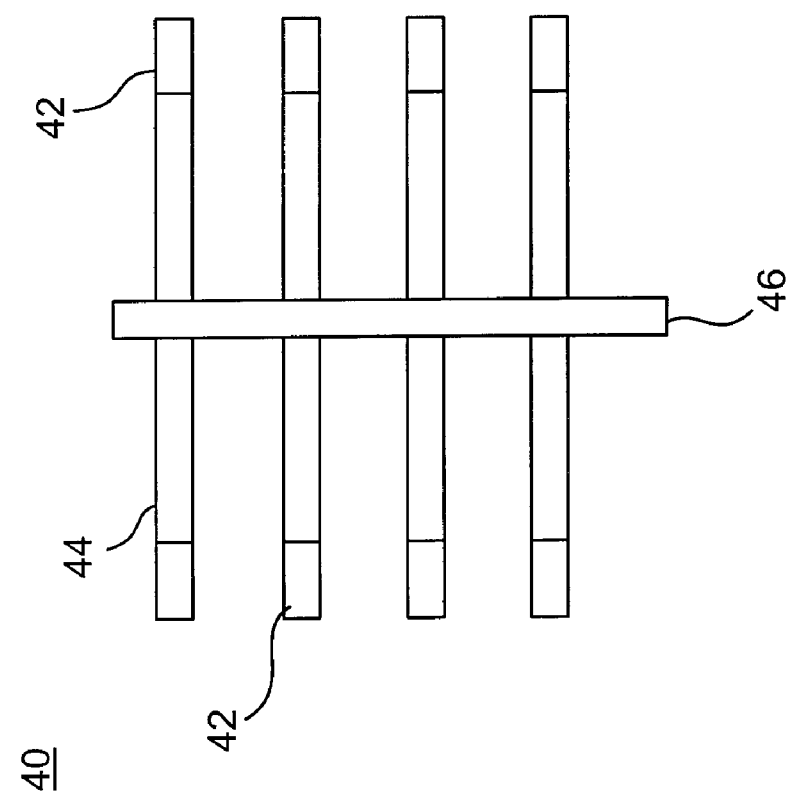

Such large area coiling structure as in large-scale deflecting MEMS actuator 30 may be utilized for a number of applications, including without limitation as a shutter actuator in which nanocoil 32 provides rotational motion and acts as a light shutter. With reference now to FIGS. 3A-3B, shown is another application of large area coiling structure of nanocoil 32, an embodiment of tunable, variable antenna 40 fabricated using nanocoils 42. FIG. 3A shows tunable, variable antenna 40 in ON position with an array of nanocoils 42 uncoiled, forming nanocoil arms 44. As shown, nanocoils 42 are nearly fully deflected away from anchor 46 of antenna 40, in OFF position. Anchor 46 acts as an anchor for the nanocoil arms 44, to which they remained attached. Accordingly, a pull-down voltage is being applied in FIG. 3A to nanocoils 42. Nanocoil 42 may be fabricated from silicon nitride/silicon ($Si_2Ni_4$/Si), where the $Si_3Ni_4$ is a stressed nitride coiling layer. A SOI (silicon-on-insulator) wafer may be used to provide the silicon layer and a buried-oxide layer (BOX) (e.g., $SiO_2$) that is removed to release the nanocoil.

The embodiment of variable, tunable antenna 40 shown in FIG. 3A is a actually a group of dipole antennas formed by paired nanocoil arms 44, lined one above another. In the embodiment shown, each nanocoil arm 44 of the antenna is one quarter wave length long when fully extended (as in FIG. 3A), with the left and right nanocoil arms 44 together being half a wavelength. By un-curling and curling the left and right nanocoil arms 44 in tandem, the quarter and half wavelength that each of these antennas receives is altered, thus tuning antenna 40. The length of nanocoil arms 44 (i.e., the amount nanocoils 42 are deflected or uncoiled) is determined by amount of pull-down voltage applied. The length of nanocoil arms 44 determines the wavelength of the signals collectible by tunable, variable antenna 40. Consequently, tunable, variable antenna 40 may be tuned to a specific wavelength by adjusting the pull-down voltage and, hence, the length of nanocoil arms 44.

With reference to FIG. 3B, shown is tunable, variable antenna 40 with nanocoils 42 almost fully-coiled towards center 46. As shown, nanocoil arms 44 formed by uncoiled nanocoils 42 are much reduced in length from FIG. 3A. Hence, tunable, variable antenna 40 in FIG. 3B is capable of receiving a different wavelength of signals then tunable, variable antenna 40 in FIG. 3A. Electrodes 48 for applying pull-down voltage to nanocoils 42 are revealed in FIG. 3B. Layout of electrodes 48 shown is similar to layout of electrodes 34 in large-scale MEMS actuator 30 shown in FIG. 2.

Figure 4:
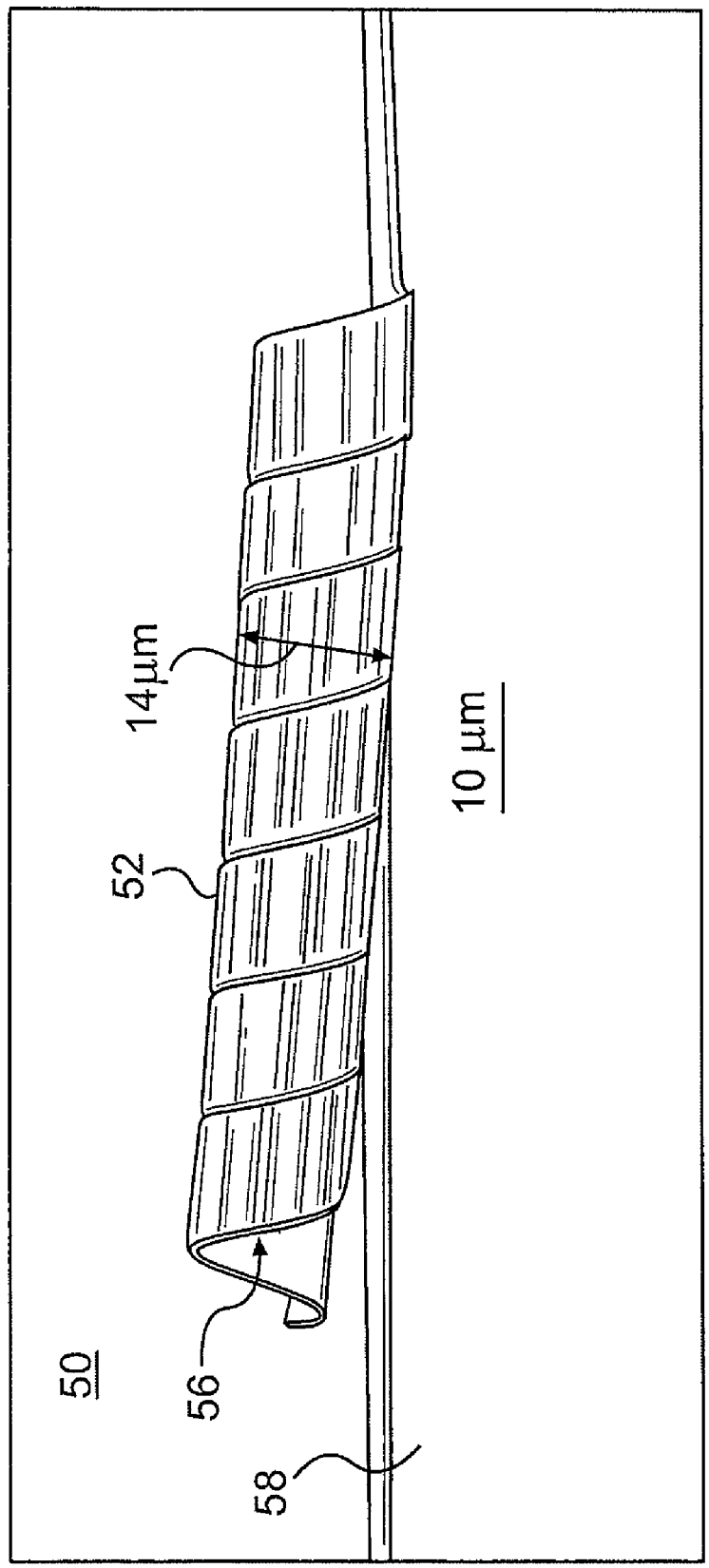
FIG. 4 is a block diagram illustrating an embodiment of an inductor or traveling wave tube device.

With reference now to FIG. 4, shown is another application of a device fabricated using nanocoils. Specifically, shown is an embodiment of an inductor or traveling-wave tube device 50. Whether the application is an inductor or traveling-wave tube device, a metallic helical nanocoil tube 52 with a tight radius controllable pitch and an air core 56 is provided. Pitch is the distance between each coil of nanocoil tube 52. Air core 56 is open core formed by helical nanocoil tube 52. Nanocoils are ideal for such inductor or traveling-wave tube devices 50 because nanocoil tube 52 may be designed with a tiny coiling radius (e.g., a ~7 um radius) and the nanocoil tube 52 may be designed to coil at a desired pitch, as described below. Furthermore, nanocoil tubes 52 have been successfully metalized without affecting the tight coiling radius. Nanocoil tubes 52 may be fabricated from silicon nitride/silicon ($Si_2Ni_4/Si$), where the $Si_3Ni_4$ is a stressed nitride coiling layer. A SOI (silicon-on-insulator) wafer may be used to provide the silicon layer and a buried-oxide layer (BOX) (e.g., $SiO_2$) that is removed to release the nanocoil.

As noted above, the '885 application describes nanocoils and methods of making nanocoils. Basically, a method of fabricating nanocoils, such as in the '885 application, includes forming a desired circuit layer, disposing optional insulator layers above and below the circuit layer, disposing a tensile stressed coiling layer (typically nitride) beneath or above the circuit layer and disposing a buried, sacrificial oxide layer beneath all of the layers, all on a substrate, typically silicon. A SOI wafer may be used to fabricate a nanocoil (a SOI wafer is a "silicon-on-insulator" wafer, a silicon wafer with a thin layer of oxide (SiO2) buried in it; devices/circuits are built into a layer of silicon on top of the buried oxide; SOI substrates provide superior isolation between adjacent devices in an integrated circuit as compared to devices/circuits built into bulk wafers). SOI wafers are ideal as they inherently contain a buried oxide layer and thin single crystalline silicon top layer. In an example, a BOX layer of 2000 Å and a top single crystalline silicon layer of 700 Å may be utilized. A tensile stressed nitride layer of 700 Å was deposited directly to the top silicon layer and the coiling arm structure may be patterned (e.g., by reactive-ion-etching (RIE) to expose BOX). The sacrificial layer may be an oxide, typically silicon oxide, or other sacrificial material.

The circuit layer may be memory, control or other circuitry as desired. The layers formed form a coiling arm structure that when released will coil into the nanocoil. The sacrificial oxide layer may be selectively removed, typically with a wet hydrofluoric (HF) acid, releasing the layers, including the circuit layer, from the substrate so that the layers coil into a dense, coiled device, the nanocoil. A metallization layer (e.g., gold) may be applied to protect the stressed coiling layer before applying the HF acid. Such methods may be used to fabricate the nanocoils used in the applications shown in FIGS. 1-4 herein. See also U.S. patent application Ser. No. 11/524,246 entitled "Method For Fabricating Nanocoils," filed herewith on Sep. 21, 2006 and U.S. patent application Ser. No. 11/524,244 entitled "Improved Nanocoils, Systems and Methods For Fabricating Nanocoils," filed herewith on Sep. 2006, both of which are hereby incorporated by reference in their entirety, for nanocoil fabrication methods that may be used.

Figure 5A:
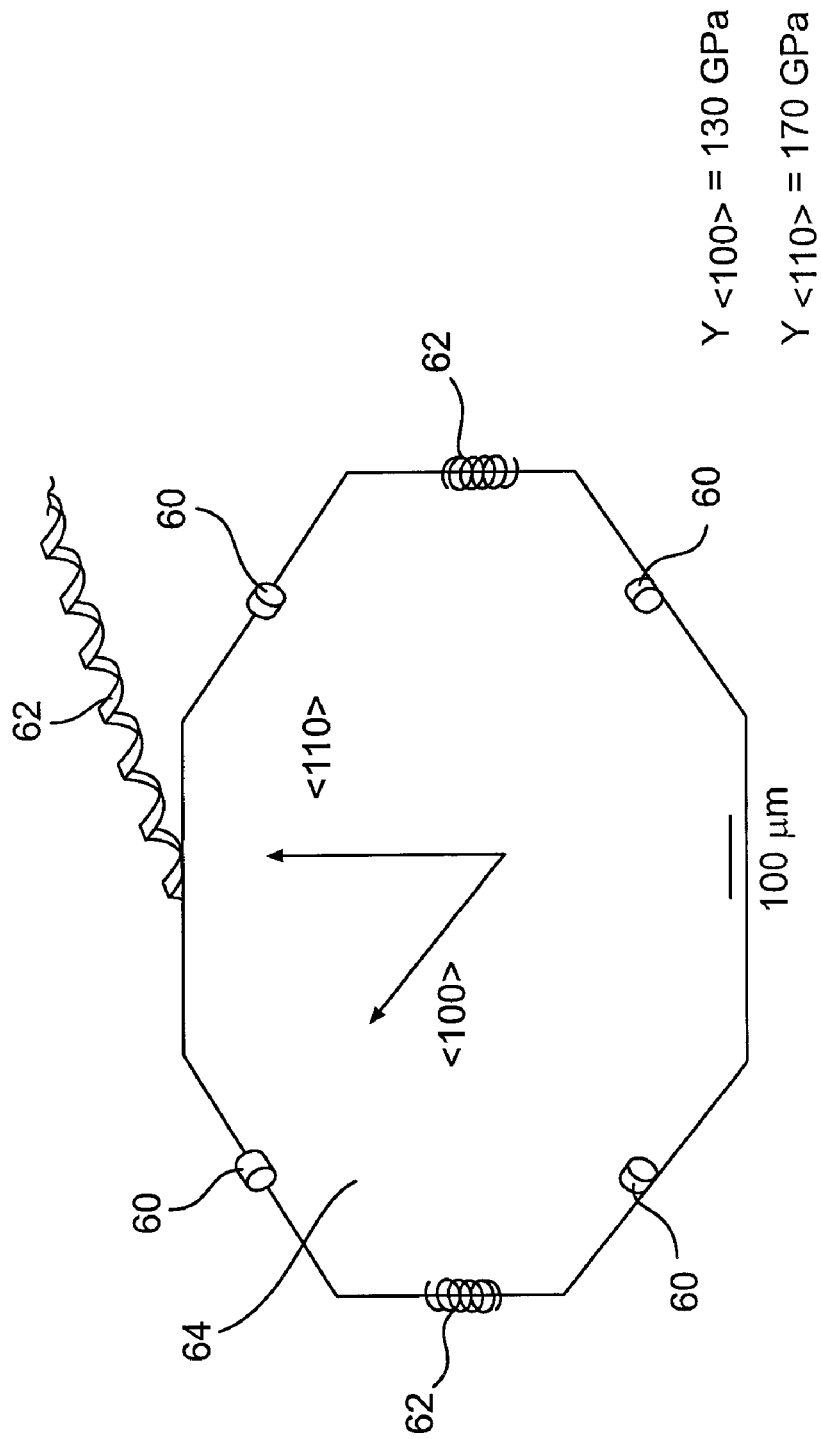
Figure 5B:
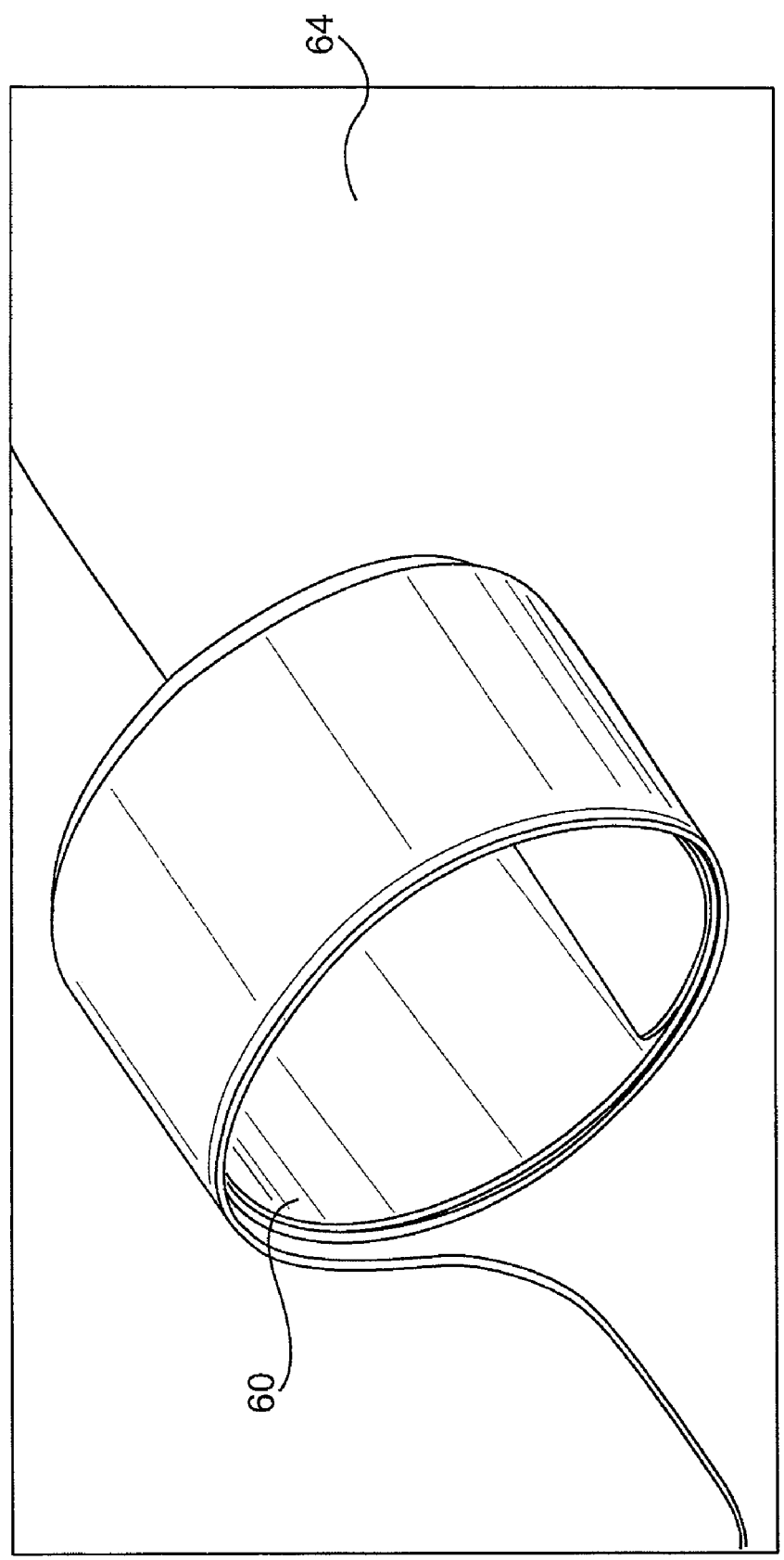

With reference now to FIGS. 5A-5C, shown are single crystal silicon nanocoils 60, 62 formed from wet HF acid releases (removal of buried oxide layer with wet HF acid to release nanocoil) from SOI wafer (Si-crystal substrate 64). In the embodiments shown, wet HF acid releases were performed on 10 μm wide nitride/crystalline Si coiling arms, which contain Si substrate, stressed nitride insulation and metallization layers. After patterning the coiling arm structures (i.e., forming circuit layer and other device layers described above), the coiling arm structures were encapsulated with a topside Cr/Au 100A/100A metallization to protect the stressed nitride from the HF acid. The buried oxide (or other sacrificial layer material) underneath the coiling arm structures was then selectively removed in a HF acid dip, which dissolved the oxide starting at the edges of the coiling arm structure. The dissolving of the oxide layer laterally undercut the coiling arm structures and released the coiling arms as the oxide was removed. Once the oxide was completely dissolved, the device layers (the coiling arms) were free to coil away from substrate 64, forming nanocoils 60, 62.

FIGS. 5A-5C illustrate some important characteristics of the crystalline Si nanocoils 60, 62. For example, the spiraling (or coiling) angles of nanocoils 60, 62 were found to be dependent on the orientation of the coiling arm structure with respect to the underlying crystal: coiling arm structures formed with their primary longitudinal axis in the $Y_{<100>}$ directions (i.e., the crystalline direction of Si-crystal substrate 64) self-assembled into tightly packed concentric nanocoil 60, as seen in FIG. 5B, while coiling arm structures formed with their primary longitudinal axis in the $Y_{<110>}$ directions self-assembled in a spiral nanocoil 62 with a uniform pitch (distance between each coil in nanocoil 62) and uniform spiraling/coiling angle (angle of spirals of nanocoil 62 to $Y_{<100>}$ direction), as shown in FIG. 5C.

FIG. 5A shows one $Y_{<100>}$ directional-axis and one $Y_{<110>}$ directional axis. The $Y_{<100>}$ directional-axis is at an angle forty-five degrees (45°) from the flat plane formed by the bottom-side of the octagonal shape of the SOI wafer (Si-crystal substrate 64) shown in FIG. 5A (i.e., the side facing the bottom of the page). Accordingly, the $Y_{<110>}$ directional axis is forty-five degrees (45°) from the $Y_{<100>}$ directional-axis and is at an angle of ninety degrees) (90°) with the bottom-side of the SOI wafer. The $Y_{<100>}$ shown is arbitrarily labeled based on the current bottom-side of the SOI wafer. Since the SOI wafer is symmetrical, the SOI wafer could be rotated ninety degrees (90°) and a new $Y_{<100>}$ directional-axis labeled at forty-five degrees (45°) from the "new" bottom-side with the same crystalline characteristics and resulting coiling characteristics as described herein. In other words, because of the symmetry of the SOI wafer shown in FIG. 5A, labeling of axes (e.g., the "x, y and z" axes) is arbitrary. Accordingly, the additional "$Y_{<100>}$ directional-axes" are clockwise at ninety degrees (90°), one-hundred eighty (180°), and two-hundred seventy (270°) from the $Y_{<100>}$ directional-axis shown. Consequently, the same concentric nanocoils 60 were also produced on these axes (see FIG. 5A). The same logic is applicable to the $Y_{<110>}$ directional axis. Accordingly, the same spiral nanocoils 62 were produced on these additional $Y_{<110>}$ directional axes (note, the spiral nanocoil formed on the bottom-side of the SOI wafer shown in FIG. 5A broke off from its anchor pad and is not shown).

The tendency of the coiling arms to coil (form nanocoils 60) along the $Y_{<100>}$ crystalline directions may be explained by the anisotropy of Young's modulus, which varies from 130 GPa along the $Y_{<100>}$ directions to 170 GPa along the $Y_{<110>}$ directions. In other words, the Si substrate in the coiling arm structures are stiffer when oriented along the $Y_{<110>}$ directions then when oriented along the $Y_{<100>}$ directions (similarly the SOI wafer will always tend to cleave on along the plane formed by the $Y_{<100>}$ directions). Indeed, the $Y_{<100>}$ directions, the crystalline orientation of the single crystal Si substrate 64, are the weakest or least stiff direction of Si substrate. Consequently, by coiling along the $Y_{<100>}$ directions, the biaxial stress on nanocoils 60,62 is preferentially acting along the most compliant direction (i.e., in the direction of the underlying crystal orientation). While the nanocoils 60, 62 naturally tend to coil towards the $Y_{<100>}$ directions (the most compliant direction), the increased stiffness in the $Y_{<110>}$ directions prevents from coiling completely in the $Y_{<100>}$ directions. Accordingly, the gradient of stiffness of the coiling arm structure appears to be a key factor in determining the pitch of the resulting nanocoil.

Additionally, as seen in FIG. 5A, after releasing coiling arm structures, seven (7) of the eight (8) nanocoils 60, 62 remained intact and attached to the anchor pad (anchor pad is material connected to or that is part of coiling arm structure which does not have buried oxide underneath of it. Consequently, anchor pad remains connected to substrate 64 and does not coil when coiling arm is released). This 85% yield was representative of coiled structures across this wafer and is a 10× improvement over previous release experiments, which did not utilize metal encapsulation layer. The improved yield is attributed to the application of the metal cap, which acts to toughen the released arms against breakage while they are subjected to turbulence in the wet release and rinse steps. In a working nanocoil device, this top metallization can share a dual purpose of protecting the nitride layer as well as interconnecting the active devices areas along the length.

Figure 6A:
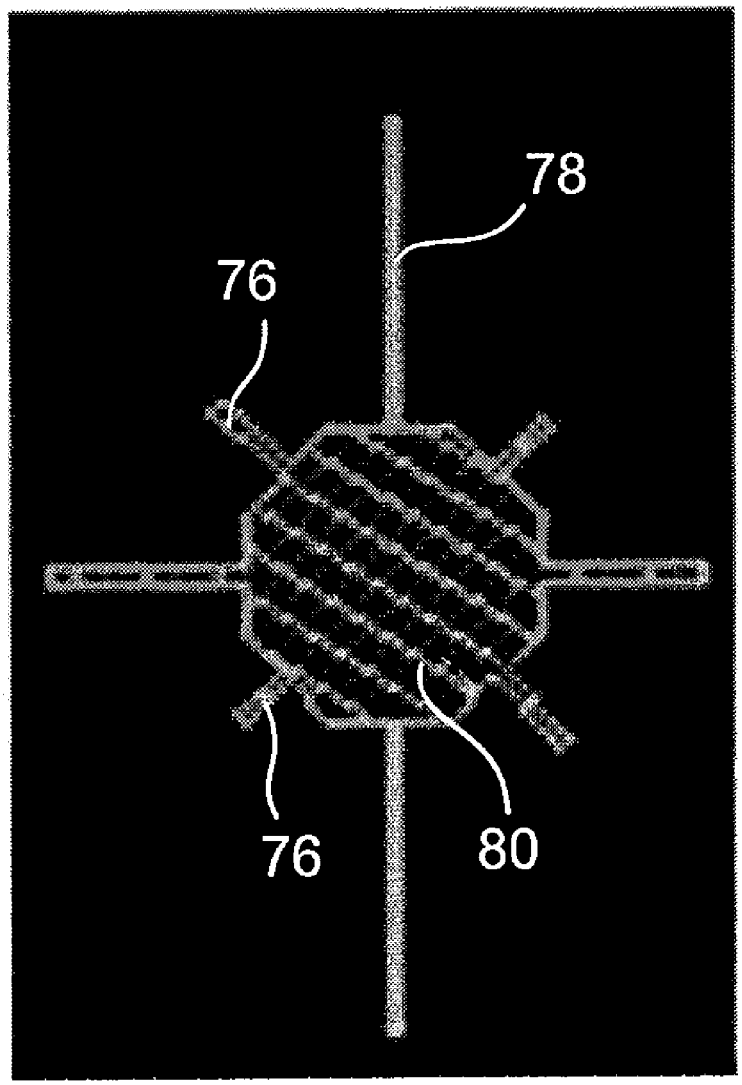
FIGS. 6A-6D are electron microscope views of nanocoils and diagrams illustrating varying coiling arm structures' orientations that produced the nanocoils.
Figure 6B:
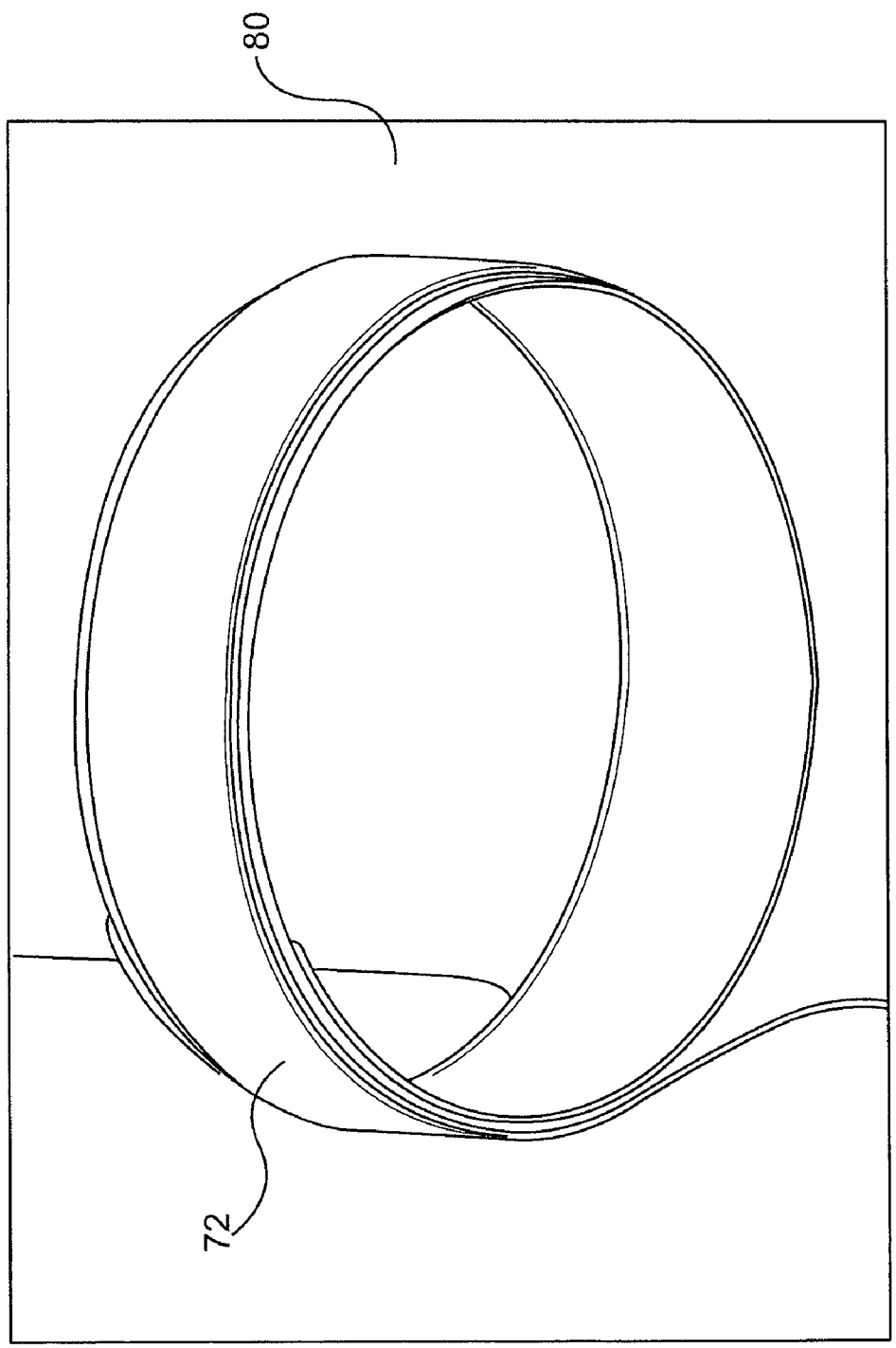

With reference now to FIGS. 6A-6D, shown are coiling arm structure orientations for controlling nanocoil spiral pitch and nanocoils 72, 74 produced using such orientations. With reference to FIG. 6A, shown are coiling arm structure orientations 76, 78. Coiling arm structures that are formed along orientation 76 are on-axis (i.e., on $Y_{<100>}$ directional-axes—oriented in $Y_{<100>}$ directions) on single-crystal Si substrate 80 while structures formed along orientation 78 are off-axis (i.e., forty-five degrees (45°) from $Y_{<100>}$ directional-axes—oriented in $Y_{<110>}$ directions) on single-crystal Si substrate 80. On-axis structures induce concentric coiling, producing nanocoil 72 shown in FIG. 6B. Off-axis structures induce spiraling, producing spiral nanocoils (such as nanocoil 62 shown in FIG. 5C.

Figure 6C:
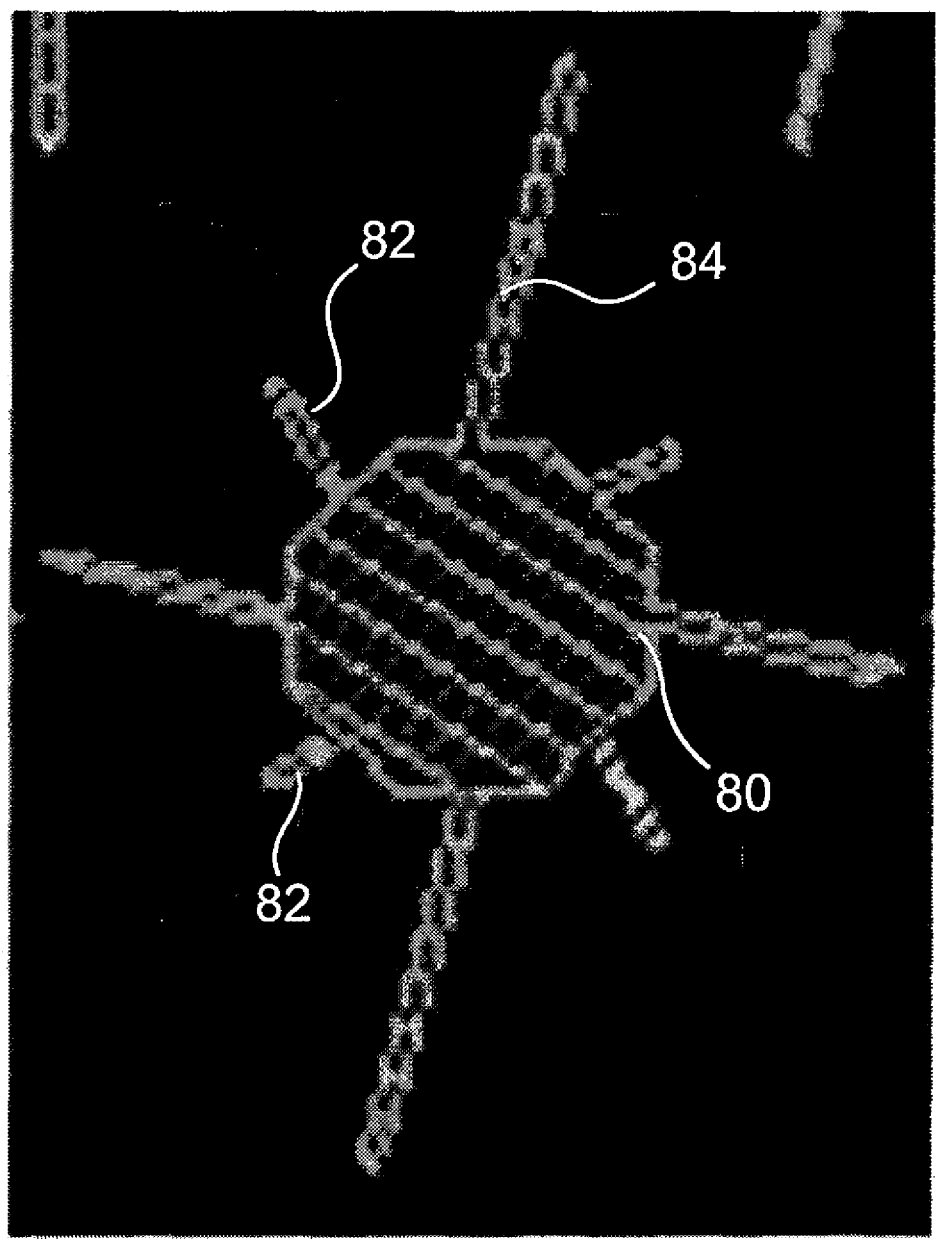
Figure 6D:
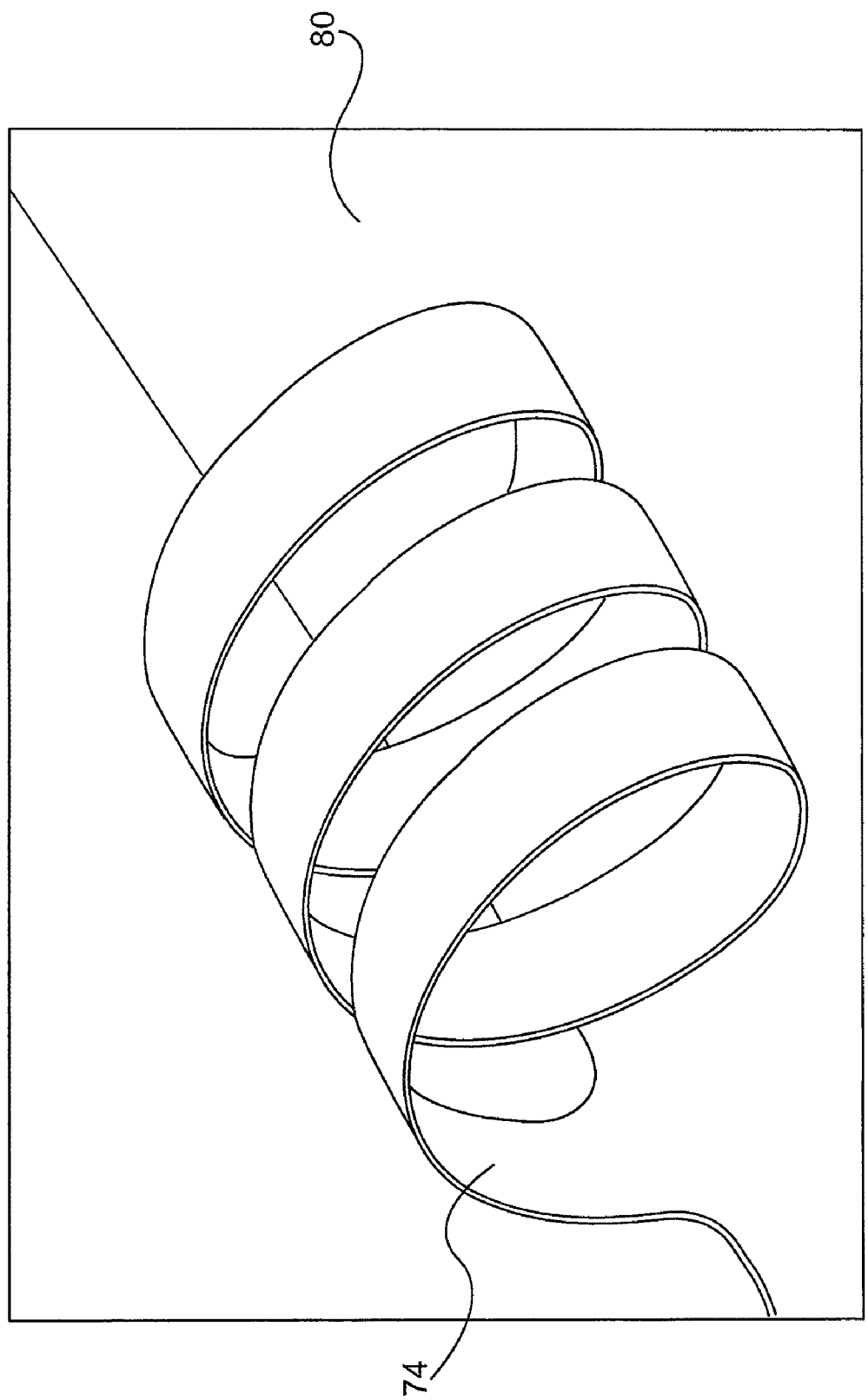

With reference now to FIG. 6C, shown are coiling arm structure orientations 82, 84. Coiling arm structure orientations 82 are oriented at a small, finite angle (e.g., fourteen degrees (14°) to the $Y_{<100>}$ directions on single-crystal Si substrate 80. In other words, coiling arm structure orientations 82 are slightly off-axis. Coiling arm structures oriented along orientation 82 may produce slightly spiraling nanocoil 74 shown in FIG. 6D. While nanocoil 74 does have measurable pitch, the spiraling angle of nanocoil 74 is small (e.g., 6°-8°). These Figures illustrate the important observation that if a coiling arm structure ("mask") is designed with the coiling arm oriented at a finite angle to the $Y_{<100>}$ axis, the pitch of the resulting nanocoil can be controlled. This observation is important in designing optimal pitch dimensions in nanocoils for the inductor and other RF applications described earlier (see, e.g., FIG. 4).

In order to more fully understand the relationship between the nanocoil pitch dependence on the angle between the $Y_{<100>}$ crystalline axis and the longitudinal axis of the coiling arm structure (the "arm angle"), the pitch on several arms are measured and discussed herein. These measurements enable a comparison of the spiraling/coiling angle of the nanocoil to the arm angle. For clarity, the arm angle is the angle of orientation of the coiling arm structure designed on Si substrate prior to coiling with respect to the flat and $Y_{<100>}$ (i.e., removal of sacrificial layer in HF acid and coiling of device layer—production of nanocoil).

Figure 7:
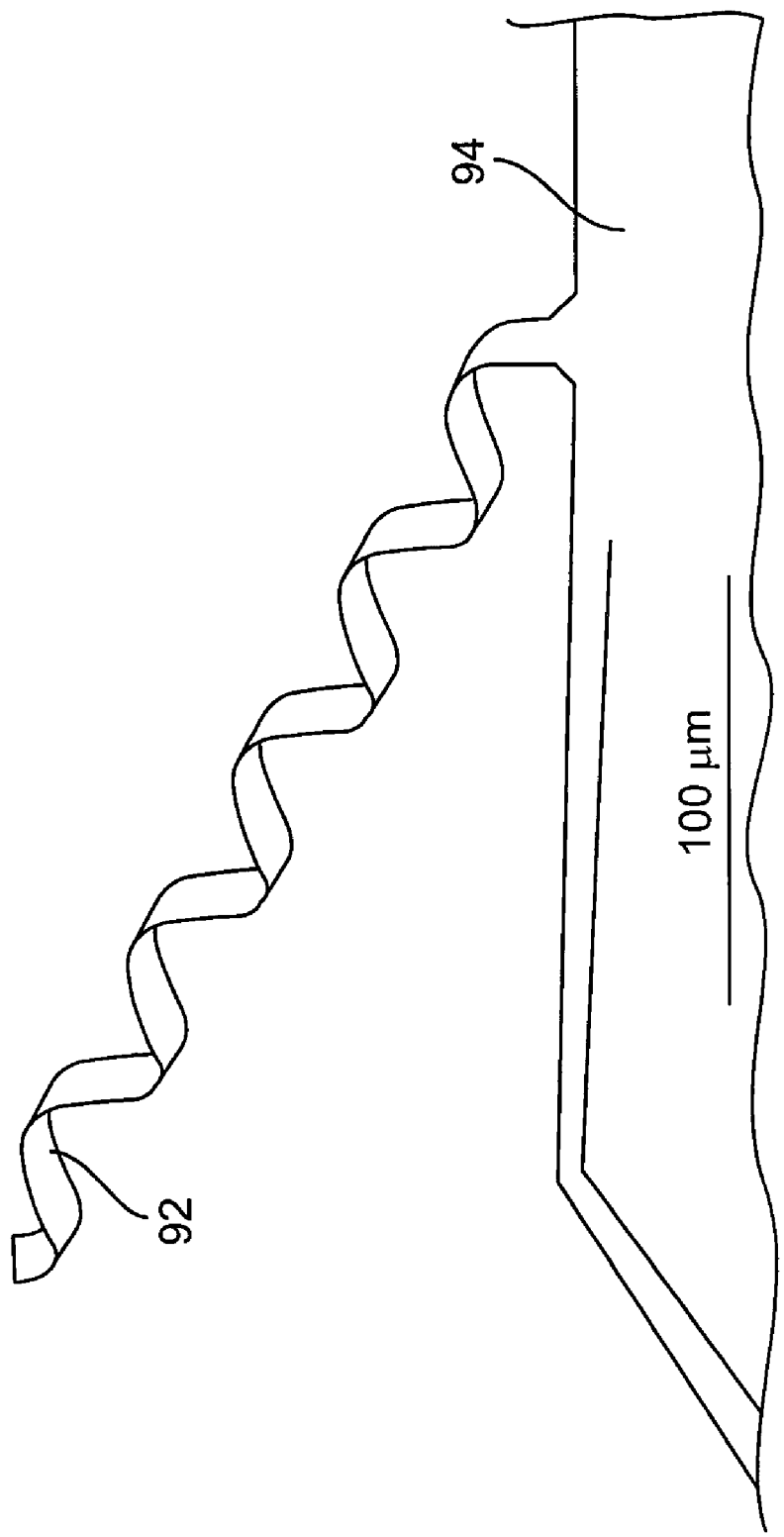
FIG. 7 is an electron microscope view of a uniform, spiral nanocoil fabricated according to an embodiment of a method of fabricating nanocoils.

With reference now to FIG. 7, shown is a single crystalline Si nanocoil 92. Nanocoil 92 was fabricated from a coiling arm structure oriented at a arm angle forty-five degrees) (45°) from the $Y_{<100>}$ directional-axis (or along the $Y_{<110>}$ directional axis) (i.e., the arm angle is 45°) on single crystal Si substrate 94. As shown, nanocoil 92 coiled in a spiral pattern with uniform pitch between subsequent coils. By measuring pitch between subsequent coils, the spiraling/coiling angle was determined to be thirty to thirty-five degrees (30°-35°) away from the $Y_{<110>}$ directional axis and within only ten to fifteen degrees (10°-15°) away from the $Y_{<100>}$ directional-axis. Nanocoil 92 was fabricated from a 1000 μm long and 10 μm wide coiling arm oriented in the $Y_{<110>}$ direction that coiled with a thirty-five degree (35°) helical spiral. Consequently, when coiling arm structures are patterned with an arm angle as much as forty-five degrees (45°) away from compliant $Y_{<100>}$ direction, the biaxial stresses combine to form a spiral which approaches the preferred direction (the $Y_{<100>}$ direction) to within fifteen degrees (15°).

With reference back to FIG. 6D, a similar phenomenon is observed for coiling arm structures that were intentionally patterned with an arm angle fourteen degrees (14°) away from the preferred direction. Nanocoil 74 coiled with a pitch representative of a coiling angle of six to eight degrees (6°-8°) toward the $Y_{<100>}$ direction. Clearly, these observations and measurements show a tendency to coil along a compliant ($Y_{<100>}$) direction even if the axis of the coiling arm structure is not oriented along the $Y_{<100>}$ direction.

These observations and measurements also show, however, that the nanocoils fabricated from coiling arm structures oriented off-axis and discussed above coil close to but never fully reach the $Y_{<100>}$ directional-axis. Forcing a nanocoil fabricated from a coiling arm structure oriented along a $Y_{<110>}$ direction to coil in a spiral such that the coiling occurs exactly along the $Y_{<100>}$ direction comes with a cost of a wider effective coiling arm width. The increased width is shown by the function W/Cos(T), where W is the width of the coiling arm and T is the coiling angle (angle between coils and $Y_{<100>}$ direction). The result of the function is a constant value; hence, decreasing the coiling angle will increase W (e.g., cos(0)=1 whereas cos (45)=0.707).

Figure 8:
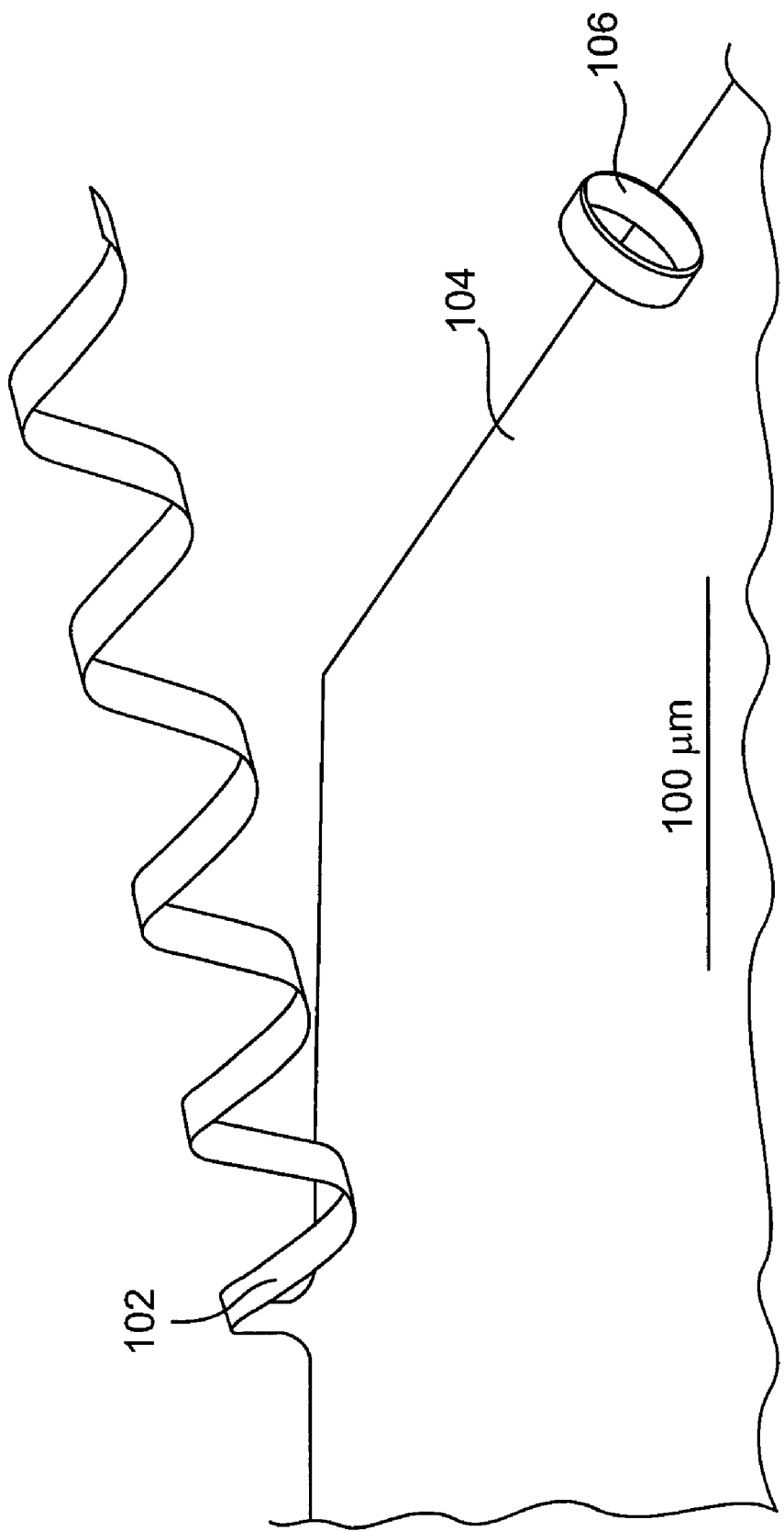
FIG. 8 is an electron microscope view of a varying pitch, spiral nanocoil fabricated according to an embodiment of a method of fabricating nanocoils.

With reference now to FIG. 8, shown is nanocoil 102 illustrating that coiling angle also is affected by coiling arm width. Nanocoil 102 is fabricated from a coiling arm structure, oriented along the $Y_{<110>}$ directional axis on substrate 104, in which the coiling arm is 1000 μm long and varies in width from 10 μm to 15 μm at the tip. Nanocoil 102 resulting from such a coiling arm structure coils in a spiral with a pitch that increases at a uniform rate along the base of nanocoil 102 to the tip of nanocoil 102, as shown in FIG. 8. By making eight (8) pitch measurements along nanocoil 102 spiral, it was found that the coiling angles vary from 21.4° to 29.9° away from $Y_{<110>}$ directional axis. Consequently, the coiling angles decrease toward $Y_{<100>}$ directional-axis from 23.6° to 20.1°. Also shown in FIG. 8 is nanocoil 106, oriented along The above results illustrate that a desired coil pitch of a nanocoil may be designed by extrapolation, e.g., varying the orientation of coiling arm structure with regards to $Y_{<100>}$ directions and by varying the width of coiling arm structure. As explained above, the gradient of stiffness of coiling arm structure appears to be a major determinant in the pitch and coiling angle of nanocoils. Such gradient of stiffness may be increased or decreased "naturally", e.g., by orienting coiling arm structure at increasing or decreasing angles from $Y_{<100>}$ directions (i.e., along stiffer $Y_{<110>}$ directions) or by increasing width of coiling arm. Such gradient of stiffness may also be increased or decreased "artificially", e.g., by including an asymmetrical pattern of metal on coiling arm structure to increase stiffness or etching out portions of coiling arm structure to decrease stiffness. Various methods of fabricating nanocoils may utilize these techniques.

Figure 9:
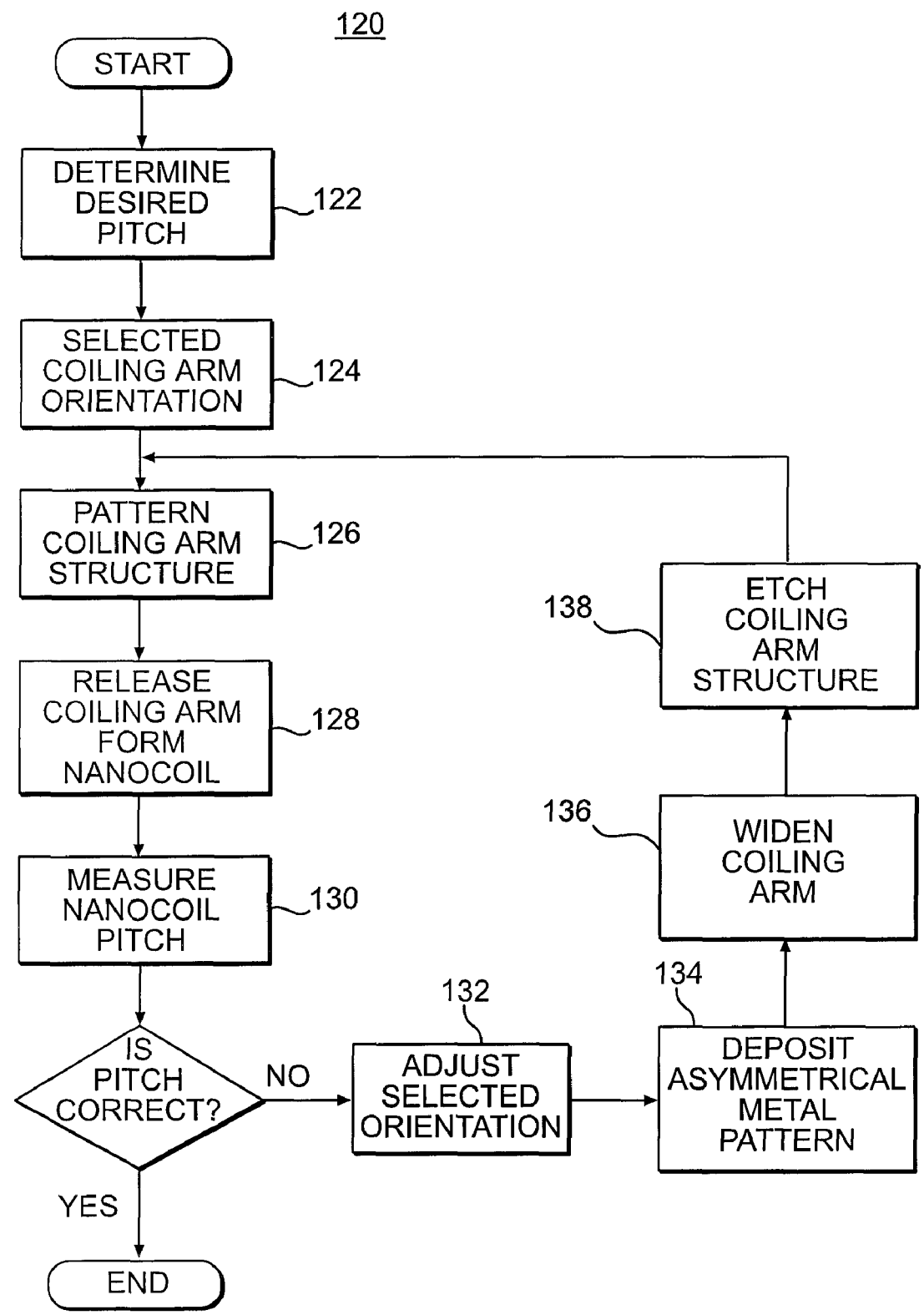
FIG. 9 is a flowchart of an embodiment of a method of fabricating nanocoils.

Accordingly, with reference now to FIG. 9, shown is method 120 for fabricating nanocoils with a desired pitch. As shown, method 120 includes determining desired pitch of nanocoil, block 122. For example, a tightly packed concentric nanocoil (i.e., zero pitch) may be desired. Alternatively, a spiral nanocoil with minimal pitch, e.g., as nanocoil 74 in FIG. 6D, or large, constant pitch, e.g., as nanocoil 92 in FIG. 7 or nanocoil 62 in FIG. 5C may be desired. The desired length, width, etc. of the nanocoil may also be determined. Once the desired nanocoil pitch is determined 122, orientation of coiling arm structure may be selected, block 124. As noted above, the coiling arm structure is the structure of coiling arm that is defined on the substrate and which coils into the nanocoil when released (e.g., by removing sacrificial oxide layer). As shown in the preceding Figures, the orientation of the coiling arm structure with regards to the crystalline orientation of the substrate (e.g., $Y_{<100>}$ directional-axis) affects the pitch of the resulting nanocoil. The coiling arm structure orientation may be defined as the arm angle between the coiling arm structure and the $Y_{<100>}$ directional-axis. The gradient of stiffness of the coiling arm may also be adjusted in other manners, as described above. After the coiling arm structure orientation is selected, the coiling arm structure is defined or patterned, block 126. This may be done as described above (e.g., with reference to the '885 application). The coiling arm is released, forming the nanocoil, block 128. This may be done using a HF acid dip to remove the sacrificial oxide layer, as described above.

The pitch of the nanocoil may be measured, block 130, to determine if the fabricated nanocoil has the desired pitch. If the nanocoil has the desired pitch, method 120 is complete. However, if the fabricated nanocoil does not have the desired pitch, or is otherwise unsatisfactory, method 120 may continue. The selected orientation may be adjusted, block 132. For example, if the pitch of the fabricated nanocoil was too small, the selected orientation may be adjusted to increase the arm angle away from the $Y_{<100>}$ directional-axis. Likewise, if the pitch was too large, the selected orientation may be adjusted to decrease the arm angle away from the $Y_{<100>}$ directional-axis. The gradient of stiffness may also be adjusted in other manners. For example, if the pitch was too small the coiling arm structure may be stiffened, e.g., by depositing an asymmetrical pattern of metal to the coiling arm structure, block 134, or by widening the coiling arm structure, block 136. Likewise, if the pitch was too large, the coiling arm structure stiffness may be decreases, e.g., by etching out portions of the coiling arm structure, block 138. These optional steps may be incorporated into the initial coiling arm structure patterning (block 126) to affect the resulting nanocoil pitch. Furthermore, these optional steps and others apparent to one of ordinary skill may be performed to decrease or increase the stiffness of portions of the coiling arm structure in order to provide varying pitch in the fabricated nanocoil. Such steps may produce a nanocoil such as nanocoil 100 in FIG. 8, in which pitch increases from the base to the tip due to increased width of nanocoil 100. After one or more of the preceding steps are performed, method 120 returns to complete the patterning and releasing, blocks 126 and 128, and the pitch of the resulting fabricated nanocoil is measured, block 130 to determine if it has the desired pitch.

Figure 10A:
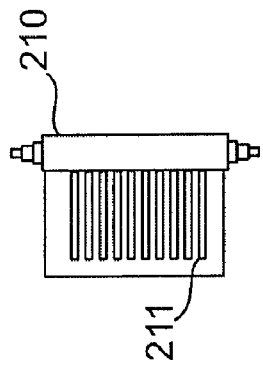
FIGS. 10A-10B are block diagrams illustrating a exemplary nanocoil and an exemplary device layer of the nanocoil.
Figure 10B:
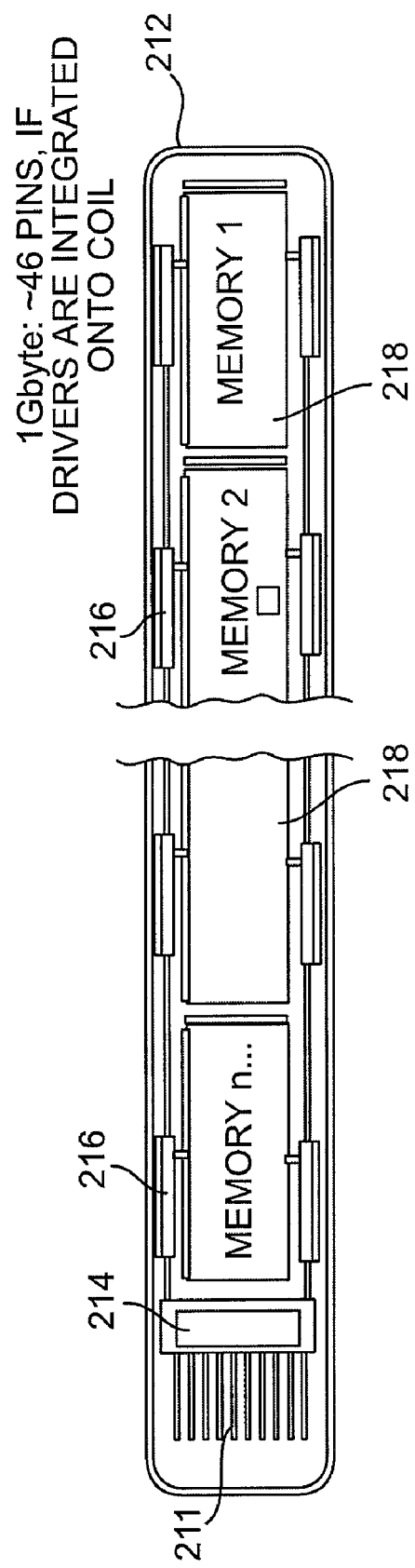

With reference to FIGS. 10A-10B, shown are top views of a memory device nanocoil 210 and a partial view of a component layout on device/circuit layer 212 an uncoiled memory device nanocoil 210. The view depicted shows a partial view of the device layer 212 defined on a coiling arm structure prior to coiling of the nanocoil 210. The nanocoil 210 includes integrated control circuitry 214, integrated memory drivers 216, memory 218 and pins 211 (e.g., on anchor pad). After the coiling arm structure is released or skimmed off, the tightly packed nanocoil 210 packs these components into a ultra-dense, low volume area. The memory device nanocoil 210 is a single crystalline Si CMOS nanocoil. Single crystalline Si provides a higher performance level than poly-crystalline Si and is generally used for circuitry.

Figure 11:
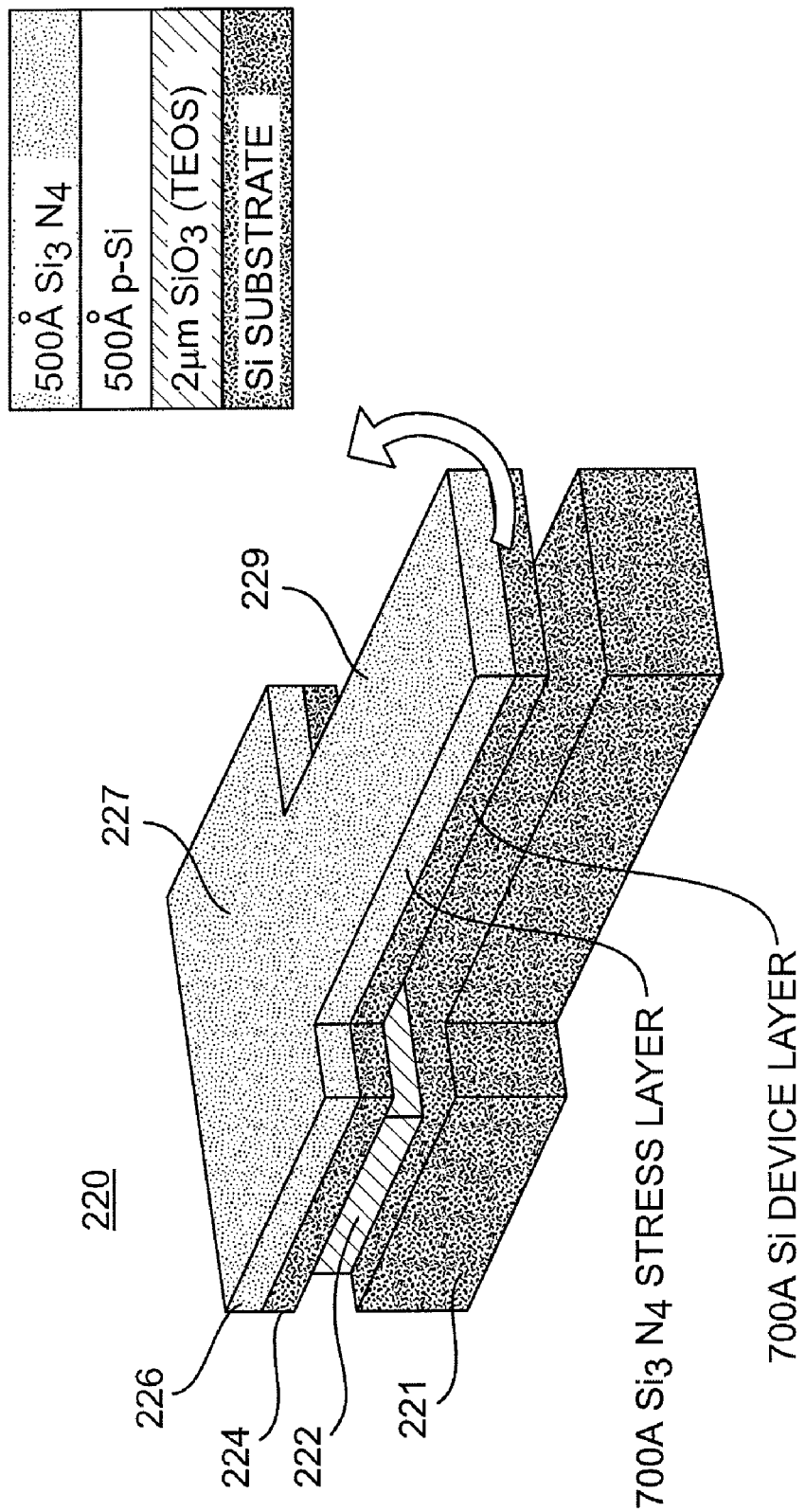
FIG. 11 is a diagram illustrating an exemplary system for fabricating nanocoils.

With reference now to FIG. 11, shown is system 220, a combination of deposited and defined layers, for fabricating polycrystalline silicon (poly-si) nanocoils. The combination of layers 220 was created using a standard fabrication technique of poly-si nanocoils, which is described herein. The technique includes depositing a thick 2 μm TEOS oxide release layer 222 (TEOS is tetraethyl orthosilicate, $Si(OC_2H_5)_4$, a gaseous compound commonly used in chemical vapor deposition (CVD) of $SiO_2$ processes (resulting deposited $SiO_2$ is called "TEOS Oxide"); TEOS thermally decomposes at around 700° C. to form $SiO_2$, although plasma enhancement lowers temperature of deposition to below 500° C.) on a silicon substrate 221, followed by a coiling layers (actually, a bi-layer) composed of a compressively stressed poly-si device layer 224 (with devices/circuits patterned thereon) and a highly tensile stressed silicon nitride layer (the "stressed nitride layer") 226 (e.g., deposited by low pressure chemical vapor deposition (LPCVD)) of approximately 500 Å each. Deposition order of device layer 224 and stressed nitride layer 226 may be reversed. Patterning/definition of device layer 224 takes place before deposition of stressed nitride layer 226 (unless deposition order reversed). Next, a coiling arm structure with anchor pad 227 and coiling arm 229 (200-1000 μm long and 10 μm wide) is patterned by RIE etching through the coiling bi-layer (device layer 224 and stressed nitride layer 226) to expose the TEOS oxide release layer 222 in field regions between coiling aim structures (typically, many coiling arm structures are patterned on a substrate at a time). Then the layers are dipped in 49% HF acid for approximately one (1) minute to allow the oxide (in TEOS oxide release layer 222) to selectively undercut and dissolve the 10 μm wide coiling arm. After the oxide under the long, narrow coiling arm 229 is dissolved, the released arm 229 coils upward, forming a nanocoil, due to the bi-layer stress state inherent in the coiling bi-layer. Because of the RIE etching and HF acid dipping, this nanocoil fabrication technique is referred to as the "wet etch" technique.

To achieve single crystalline silicon coiling for CMOS memory devices the wet etch technique may be applied to an SOI wafer (a SOI wafer is a "silicon-on-insulator" wafer, a silicon wafer with a thin layer of oxide ($SiO_2$) buried in it; devices/circuits are built into a layer of silicon on top of the buried oxide; SOI substrates provide superior isolation between adjacent devices in an integrated circuit as compared to devices/circuits built into bulk wafers). SOI was chosen because it inherently contains an oxide layer and thin single crystalline silicon top layer. In the present example, a buried oxide layer (BOX) of 2000 Å and a top single crystalline silicon layer of 700 Å was utilized. A tensile stressed nitride layer of 700 Å was deposited directly to the top silicon layer and the coiling arm structure was patterned (by RIE etching to expose BOX) and dipped in HF acid. Unfortunately, this technique was unsuccessful because the BOX etch rate in the HF is far slower than that of deposited TEOS oxide. This necessitated long (e.g., 5 minute) HF acid dip times to release 10 μm wide coiling arms. These longer dip times limit the released coil width to narrow sections of the SOI wafer surface as well as slowly dissolve the stressed nitride layer, thereby eliminating coiling stress.

Figure 12:
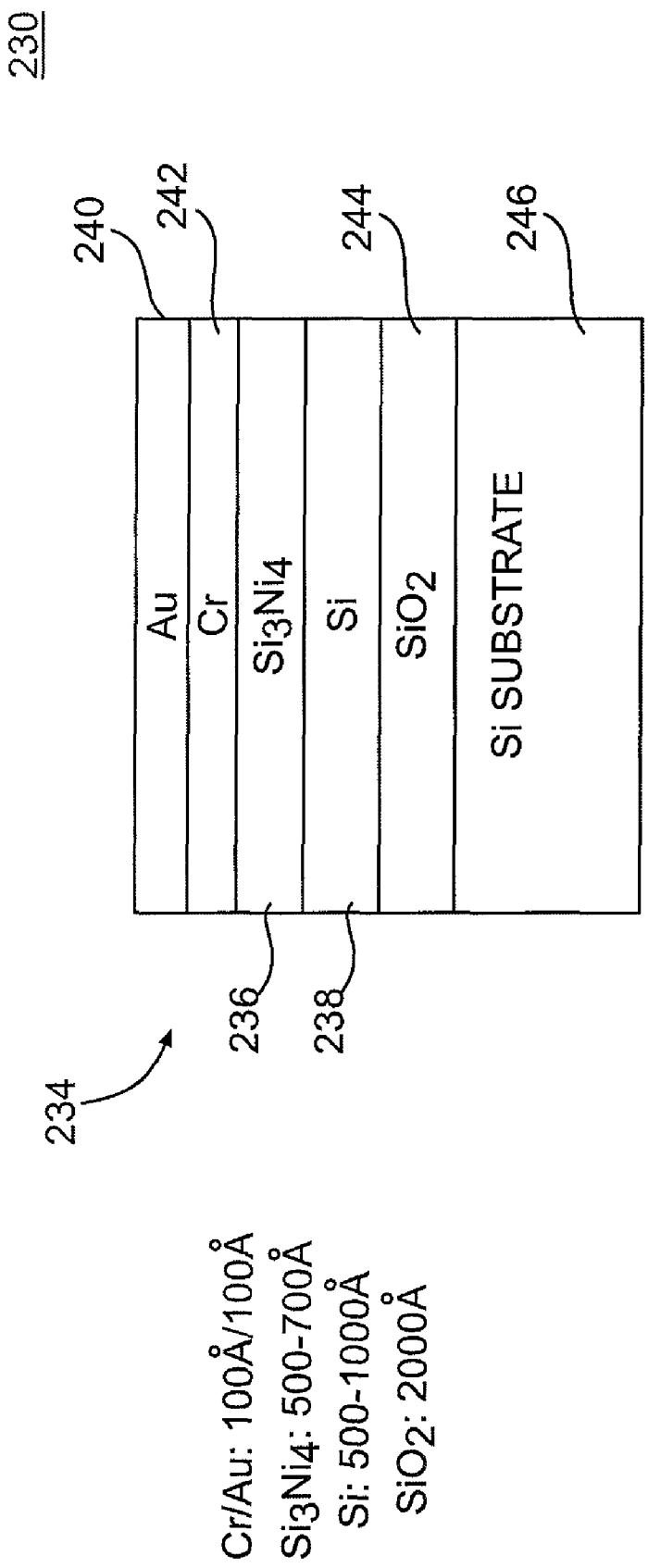
FIG. 12 is a diagram illustrating an exemplary improved system for fabricating nanocoils.

With reference now to FIG. 12, shown is a cross-section of an improved system for fabricating nanocoils. The embodiment shown enables the fabrication of single crystalline silicon nanocoils using the wet etch technique. System comprises nanocoil coiling arm structure 230 including metal encapsulation layer 234 that protects stressed nitride (e.g., $Si_3N_4$) layer 236 (and silicon device layer 238) against the long HF acid dip time required for release of the single crystalline silicon nanocoil coiling arm structure. In the embodiment shown, metal encapsulation layer 234 is a thin sputtered Chromium/Gold (Cr/Au) film or bi-layer including a Au layer 240 on top of a Cr layer 242. In the embodiment shown, the Au layer 240 and Cr layer 242 are of equal thickness (e.g., 100 Å), but one may be made thicker than the other and the layering order may be altered. Metal encapsulation or capping layer 234 is typically substantially thinner than the nitride layer 234, which typically is 500-700 Å, and silicon device layer 238, which typically is 500-1000 Å. Metal capping layer 234 withstands the HF acid dip necessary to dissolve the BOX layer 244 (e.g., 2000 Å of $SiO_2$) in order to release coiling arm structure from substrate 246. Importantly, the thin metal capping layer 234 does not significantly affect or hinder the coiling forces on coiling arm structure. More importantly, thin metal capping layer 234 does protect stressed nitride layer 236, maintaining coiling stress and significantly improving the yield of unbroken nanocoils.

Figure 13:
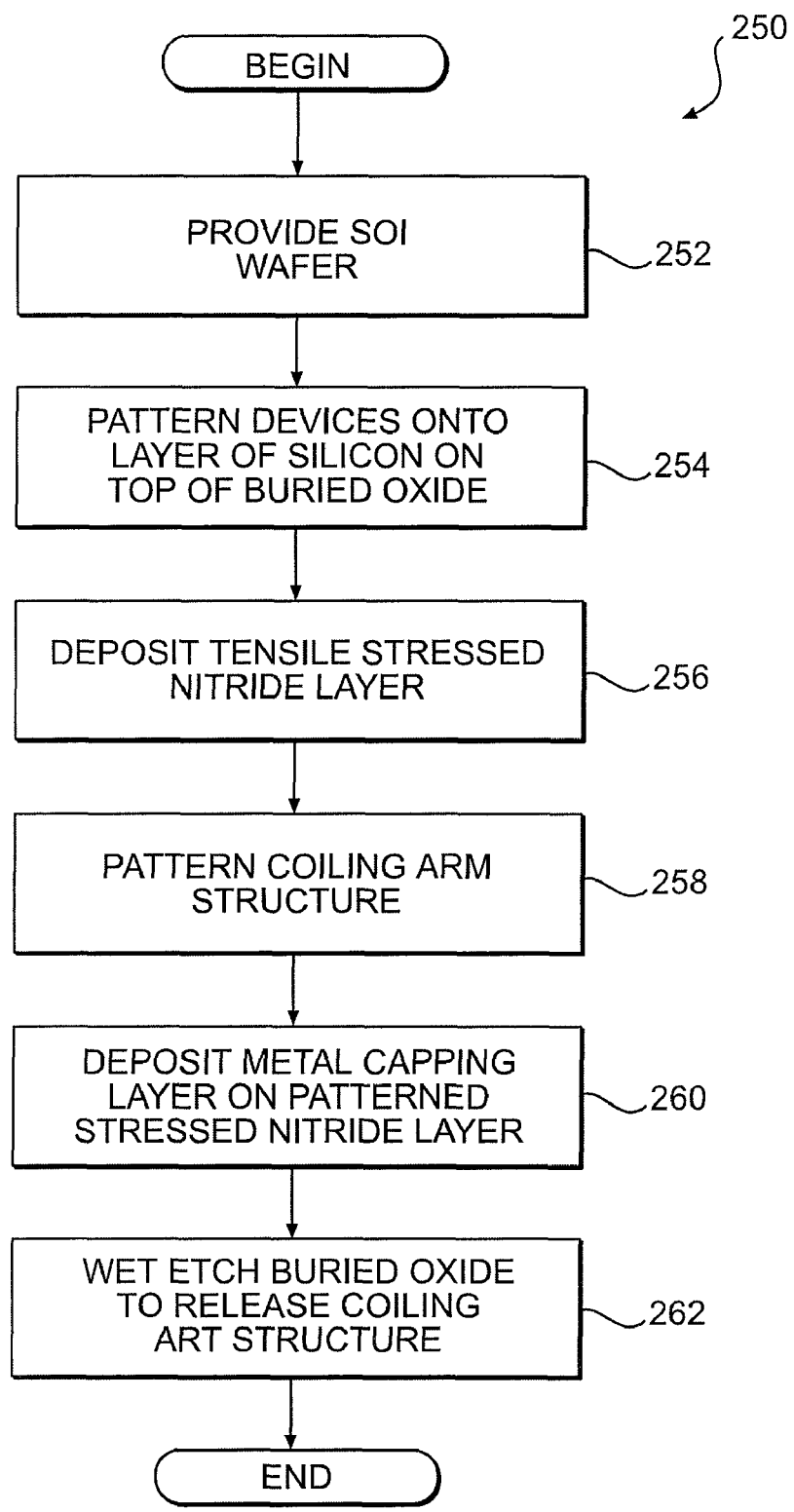
FIG. 13 is a flowchart illustrating an exemplary improved method for fabricating nanocoils.

With reference now to FIG. 13, illustrated is method 250 for fabricating nanocoils. Method 250 for fabricating nanocoils enables the fabrication of single crystalline silicon nanocoils using the wet etch technique. A SOI wafer is provided, block 252. Devices/circuits are patterned onto a layer of silicon on top of the buried oxide using known techniques (e.g., Silicon ASIC fabrication), block 254. The top silicon layer is typically a thin, single crystalline layer. A tensile stressed nitride layer is deposited directly to the top silicon layer, block 256. The coiling arm structure is patterned, block 258, e.g., by RIE etching or otherwise removing unused portions of top silicon layer, stressed nitride layer and overlaid portions of BOX. Removing unused portions of top silicon layer and stressed nitride layer expose sides of BOX underneath silicon layer. Metal capping layer is deposited on patterned stressed nitride layer, block 260. Metal capping layer may be deposited, e.g., by sputtering on Cr/Au bi-layer. The entire SOI wafer structure is dipped in HF acid (e.g., 49% HF) to dissolve BOX layer and release coiling arm structure to coil away from SOI wafer substrate, block 262. Because of metal encapsulation, the structure may be dipped in HF acid a sufficient length of time (e.g., five (5) minutes) to dissolve BOX layer and wet release coiling arm. The HF acid typically dissolves the oxide starting at the edges of the coiling arm structure and laterally undercutting the coils as the oxide is removed. Once the oxide is dissolved, the device layers are free to coil.

Figure 14:
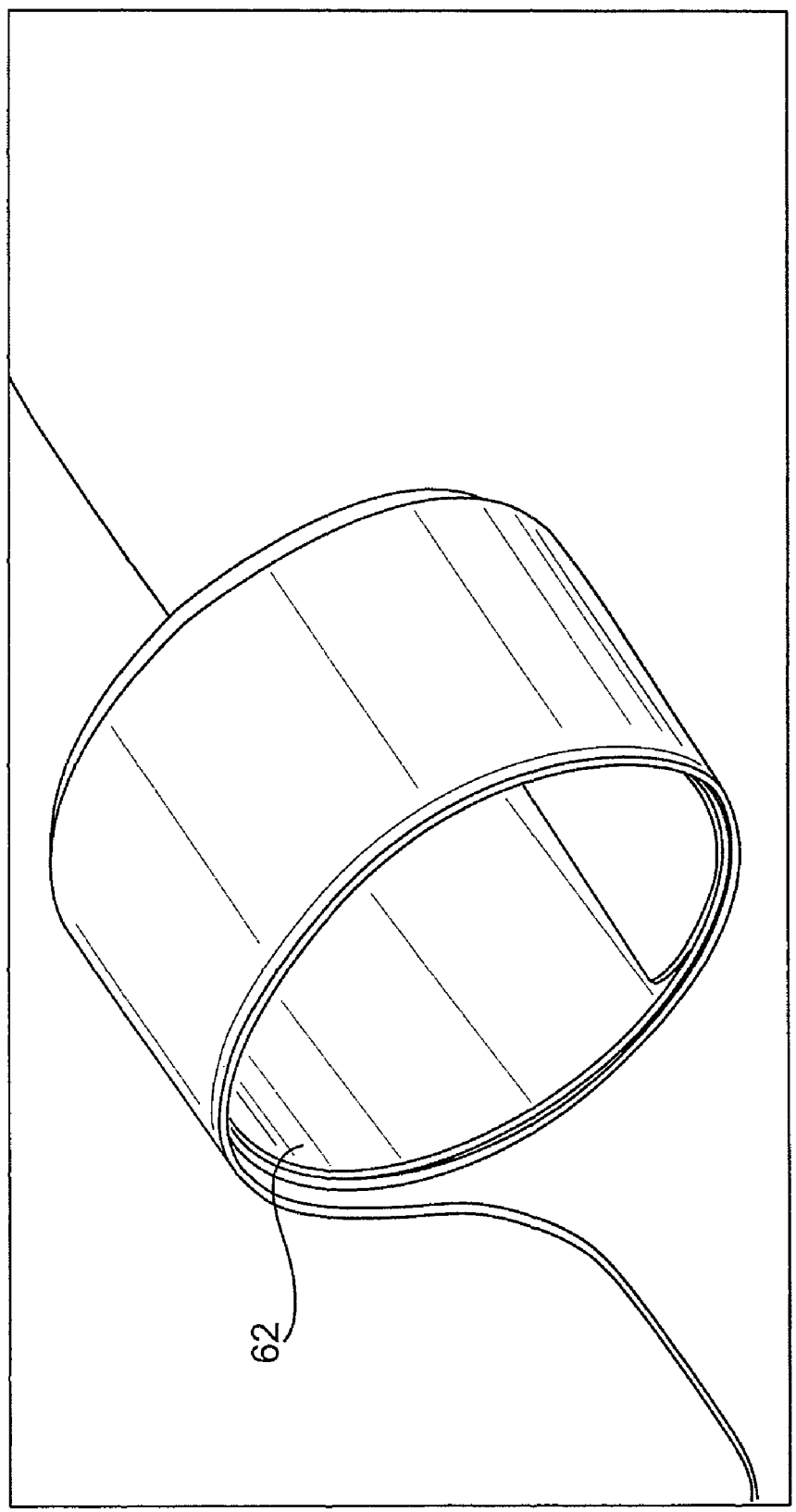
FIG. 14 is an electron microscope view of a concentrically coiled nanocoil.

With reference now to FIG. 14, a magnified view of concentrically coiled nanocoil 62 shows the predictable coiling and tight packing achievable by simply fabricating the coiling arm structures along the Y<100> directions using system 220 and method 250. Concentrically coiled nanocoil devices containing hundreds (100's) of tightly packed layers may be achieved through this process by simply releasing a coiling arm structure with a longer longitudinal arm. Such tightly packed, concentrically coiled nanocoils offer drastically increased surface storage area to volume ratios. This tight reliable coiling shows the promise of this technique to pack high periphery metal oxide semiconductor (MOS) devices into a small device footprint for enabling high current, low capacitance MOS devices. Use of metal encapsulation layer also provides back-to-back shielding between device layers in such a tightly-packed concentrically coiled nanocoil device.

Figure 15A:
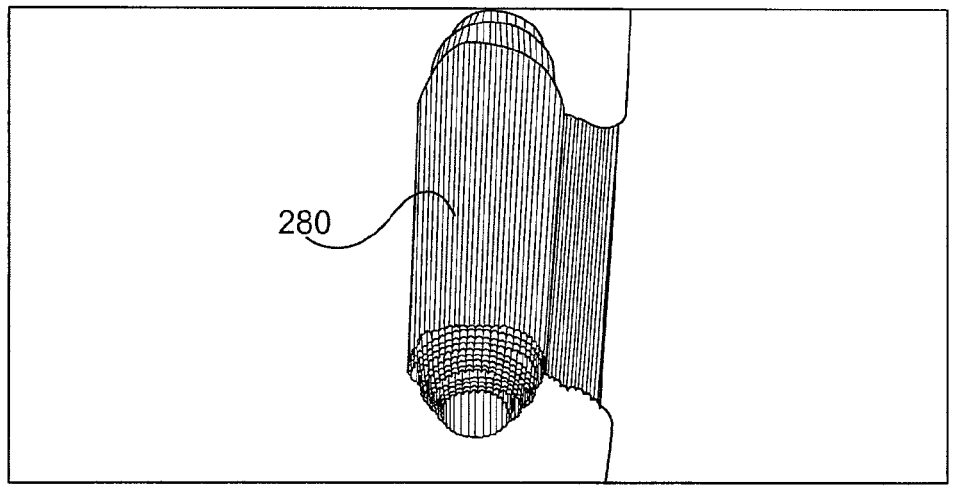
FIGS. 15A-15C are electron microscope views of a concentrically coiled, ridged nanocoil.
Figure 15B:
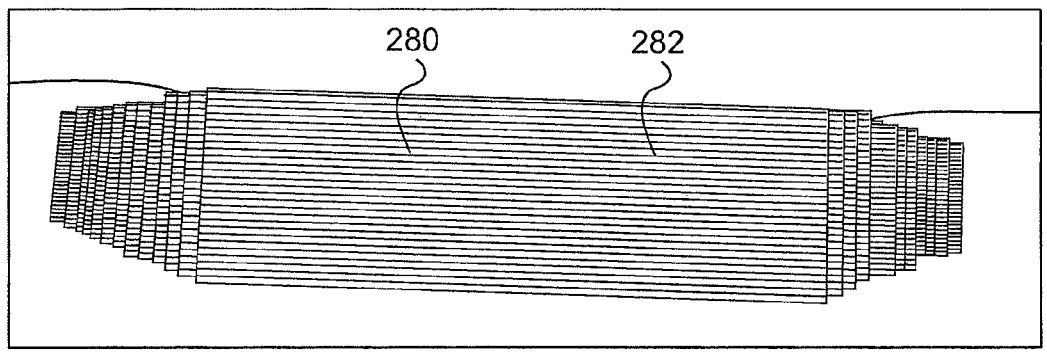
Figure 15C:
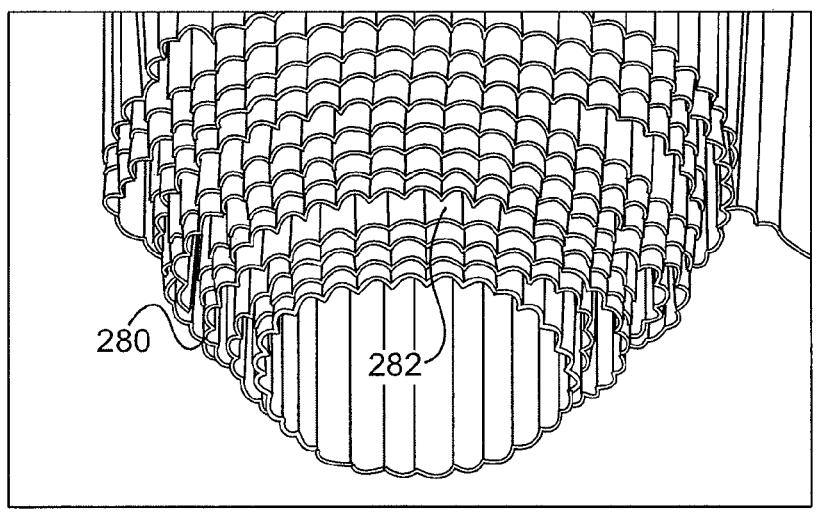

As described previously, the addition of the, e.g., Cr/Au, top metal encapsulation enables long HF acid dip times leading to the release of large area nanocoils. With reference now to FIGS. 15A-15C, shown is metal encapsulated, concentric, ridged nanocoil 280. Ridged nanocoil 280 may be fabricated using an embodiment of the methods of fabricating nanocoils described herein. Ridges may be fabricated, e.g., by putting down a layer of Boron Phosphorus Silicate Glass (BPSG), etching the BPSG into lines, heating the BPSG up, causes the BPSG to re-flow, which forms ridges. Ridged nanocoil 280 is fabricated from poly-si and includes a stressed nitride layer with a Cr/Au top metal encapsulation. Ridges 282 on ridged nanocoil 280 are approximately 2 μm in pitch (spacing between each ridge 282), 1 μm in height and run the width of the ridged nanocoil 280 arm. Ridges 282 were implemented to force uniaxial coiling along the longitudinal coiling arm direction by stiffening the transverse direction to coiling forces. The coiled ridged nanocoil 280 arm is 1000 μm in length and 100 μm wide, representing a total coiled area of 0.1 $mm^2$, a substantially larger area than any known prior nanocoil structure.

With reference to FIG. 15B, the ends of the innermost coils in ridged nanocoil 280 extend beyond the ends of each subsequent coil. This effect was designed into the coiling structure by increasing the width of the coiling arm from the base to the tip so the innermost coil was the widest. With reference to FIG. 15C, shown are a total of 13 concentric coils in ridged nanocoil 280, which were obtained in coiling the 1000 μm length of the coiling arm. During coiling, ridges 282 interlock along certain sections of ridged nanocoil 280. For example, at the 12 o'clock position on ridged nanocoil 280, looking outwards in a radial direction it can be seen that after four (4) interlocking layers, there is a region of misalignment, followed by another four (4) interlocking layers, another misalignment and the final five (5) layers. This effect is due to the 2 μm uniform spacing in ridges 282 which allows adjacent layers with closely aligned ridges 282 to lock into a lower energy state (i.e., with interlocking ridges 282). However, since the circumference of each coil in ridged nanocoil 80 increases radially as it is coiled, the number of ridges 282 per subsequent layer is always changing, forcing sections of misalignment along ridged nanocoil 280. The interlocking nature of ridged nanocoil 280 may be useful, in that with a judicious design of the ridge spacing from base to tip, it is possible to coil a ridged nanocoil device in a predictable and perfectly interlocking manner Such a ridged nanocoil would greatly facilitate the processing of radially directed metal interconnects between coiling layers, which may ultimately allow shorter current paths and superior thermal conduction away from the ridged nanocoil device.

With reference now to FIGS. 16A-16F, a variable width tip design of a coiling arm structure 290 is schematically illustrated. Specifically, FIGS. 16A-16F each illustrate a sequence of bottom and cross-sectional side views of variable width tip coiling arm structure 290, buried oxide layer (BOX) 292, anchor pad 294, substrate 296, and resulting nanocoil 298 (see FIG. 16F) as coiling arm structure 290 is released from substrate 292 (e.g., by wet etching as described above). In other words, FIGS. 16A-16F show steps of the release process of variable width tip coiling aim structure 290. As shown, coiling arm structure 290 varies in width from its narrowest portion, at connection to anchor pad 294, to its widest portion, at tip 291. Also as shown, coiling arm structure 290 is defined in the Y<100> direction. Consequently, coiling arm structure 290 will concentrically coil when released.

Figure 16A:
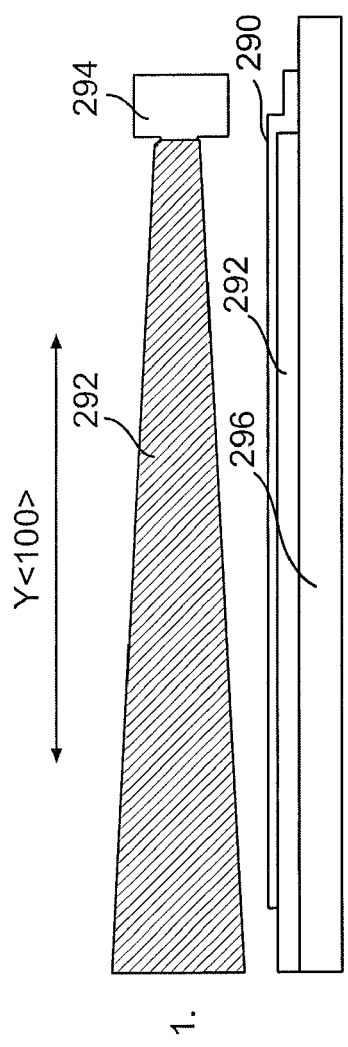
FIGS. 16A-16F are schematic diagrams illustrating a sequence of bottom and cross-sectional side views of an exemplary variable width tip coiling arm structure.
Figure 16B:
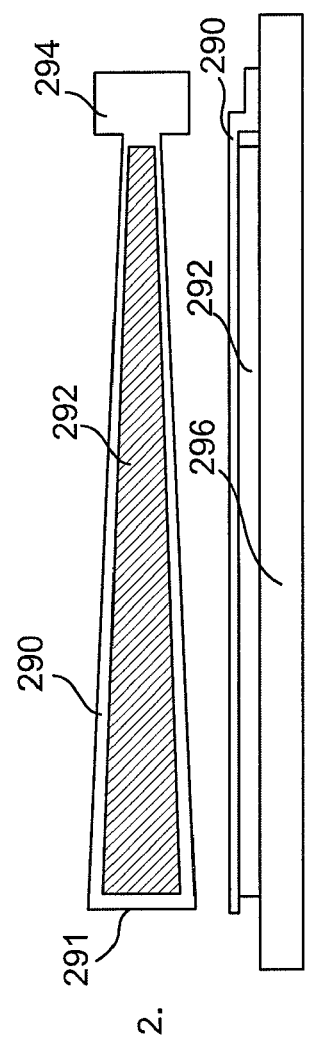
Figure 16C:
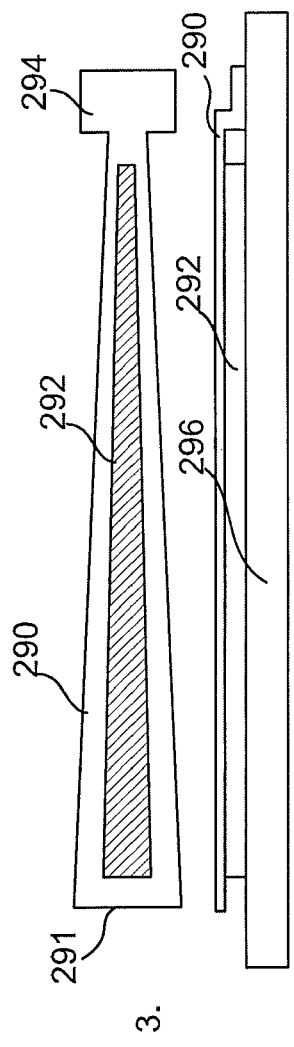
Figure 16D:
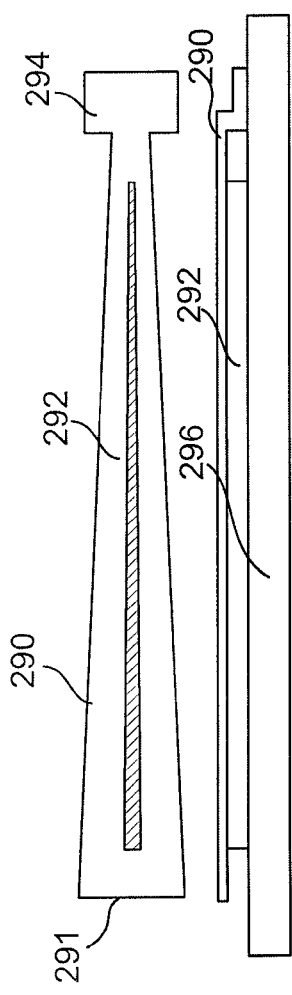
Figure 16E:
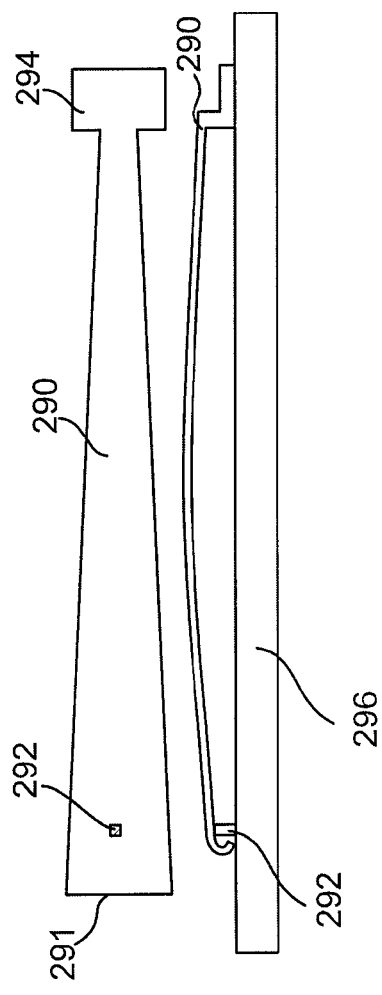
Figure 16F:
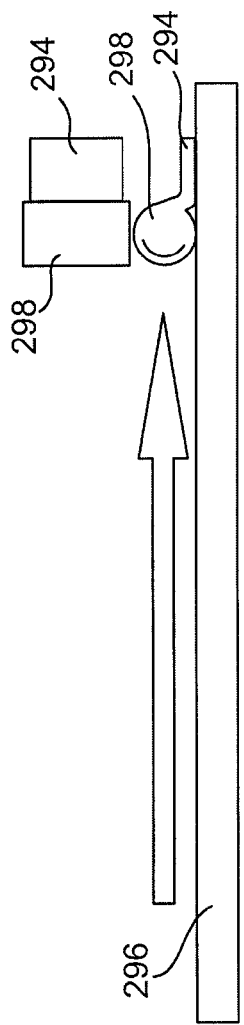

With reference to FIG. 16A, BOX 292 is un-dissolved. In the embodiment shown, BOX 292 extends beyond coiling arm structure 290. In FIG. 16B, wet etching has begun as entire structure is dipped in, e.g., HF acid dip. Edges of BOX 292 have dissolved, releasing edges of coiling arm structure 290 and exposing edges of coiling arm structure 290 to bottom view as HF acid laterally dissolves exposed sides of BOX 292, undercutting coiling arm structure 290. FIGS. 16C-16E show less and less un-dissolved BOX 292 as HF acid continues to dissolve BOX 292 from exposed sides underneath coiling arm structure 290.

As shown in FIG. 16E, the net coiling force drives the coiling of coiling arm structure 290 downwards towards substrate 292. Downward coiling may be controlled by reversing the deposition order of the films/layers, e.g., such that the tensile stressed nitride layer is deposited below the poly-Si layer, and coiling. A unique feature of the variable width tip coiling arm structure 290 as shown in steps 1-6 (FIGS. 16A-16F) is that during the isotropic wet-etching (a HF wet-etch is isotropic because it will etch oxide in all directions at the same rate) of release oxide (BOX 292) underneath coiling arm structure 90, the last portion of coiling arm structure 290 to be released is the tip 291. Tip 291 is released last because it is the widest section of coiling arm structure 290, and requires a longer time for the HF acid to etch laterally underneath tip 291 from around the edges of tip 291. At step 5 of the release process, see FIG. 16E, the length of coiling arm structure 290 to the right of the remaining oxide 296 is being held from coiling, however the tip of coiling arm structure 290 to the left of oxide 296 can initiate the downward coiling because it is only anchored at one end. At step 6, see FIG. 16F, once the release layer (BOX 296) is completely removed, coiling arm structure 290 is fully released and dynamically coils up (snaps) to anchor pad 294. This process provides a desired means of consistently processing nanocoils with multiple concentric layers because it allows coiling arm structure 290 to initiate the proper coiling direction before coiling arm structure 290 is fully released.

Using a maximally tensile stressed nitride layer is very important for coiling applications that require a tight coiling radius. This is especially true for nanocoils in which multiple or thicker layers must be coiled, for example, nanocoils with metallization (metal encapsulation layer) and passivation layers required for the fabrication of a true memory device. These multiple layers can add stiffness to the coiling arm structure, which may reduce the coiling radius.

Figure 17:
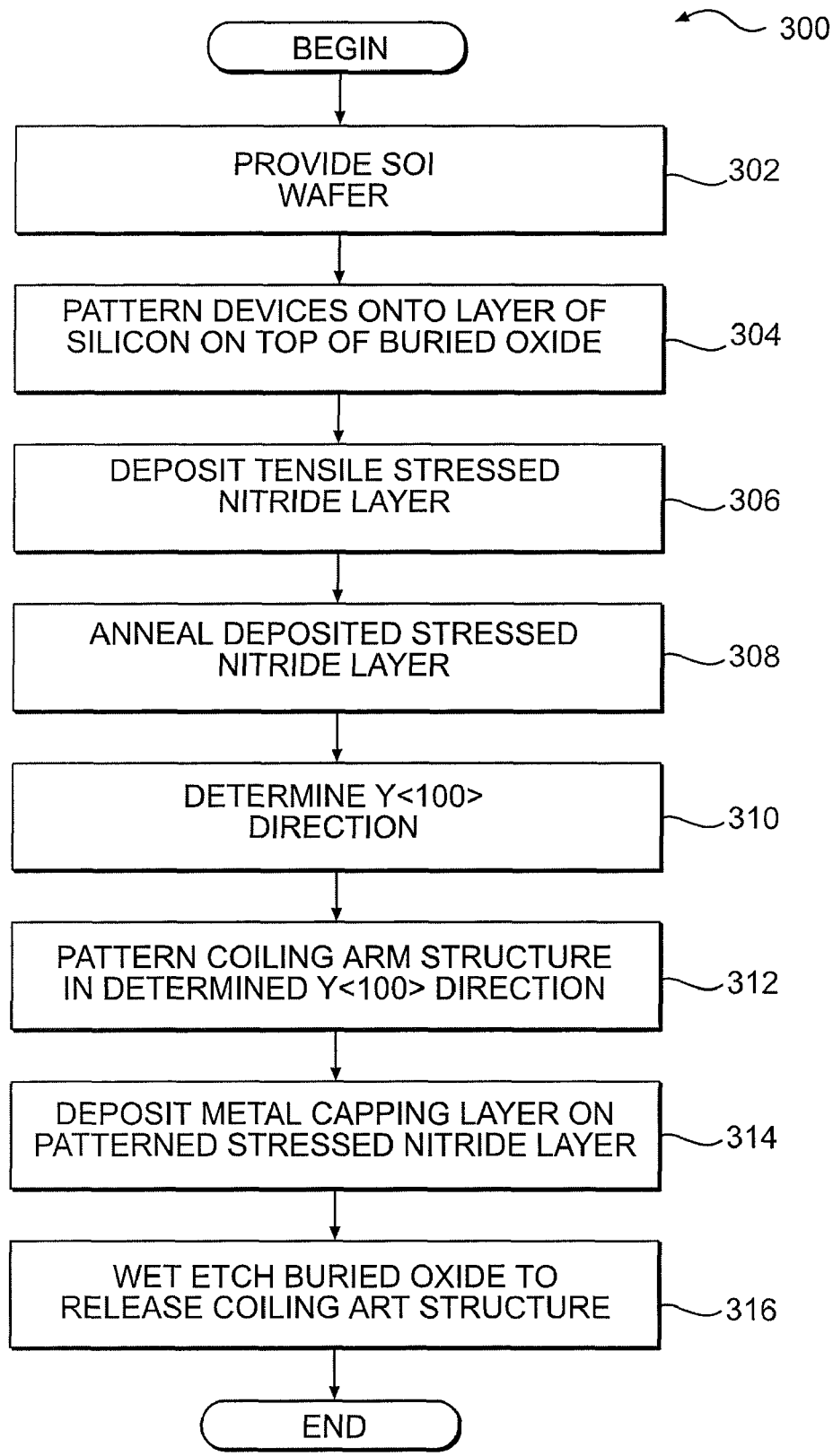
FIG. 17 is a flowchart illustrating an exemplary improved method for fabricating nanocoils.

With reference now to FIG. 17, illustrated is method 300 for fabricating concentrically coiled nanocoils. Method 300 for fabricating nanocoils enables the fabrication of tightly and concentrically coiled silicon nanocoils. A SOI wafer is provided, block 302. Devices/circuits are patterned onto a layer of silicon on top of the buried oxide using known techniques, block 304. The top silicon layer is typically a thin, single crystalline layer although a poly-Si may be used. A tensile stressed nitride layer is deposited directly to the top silicon layer, block 306. Preferably, a LPCVD or reliable, high tensile stress producing CVD system, such as Centrura™, is used to deposit the nitride layer. Deposited stressed nitride layer is annealed, block 308. For example, deposited nitride layer may be thermally annealed in a forty-five minute, 1000° C. heat treatment in a $N_2$ ambient atmosphere to prevent oxidation of the nitride. A Y<100> direction, i.e., crystalline direction, is determined, block 310. The coiling arm structure is patterned in the determined Y<100> direction, block 312, e.g., by RIE etching or otherwise removing unused portions of top silicon layer, stressed nitride layer and overlaid portions of BOX. Removing unused portions of top silicon layer and stressed nitride layer expose sides of BOX underneath silicon layer. Patterning the coiling arm structure may also include patterning a coiling arm structure with an increasing width to the coiling arm tip, as shown in FIG. 16A above.

Metal capping layer is deposited on patterned stressed nitride layer, block 314. Metal capping layer may be deposited, e.g., by sputtering on Cr/Au bi-layer. The entire SOI wafer structure is dipped in HF acid (e.g., 49% HF) to dissolve BOX layer and release coiling arm structure to coil away from SOI wafer substrate, block 316. Because of metal encapsulation, the structure may be dipped in HF acid a sufficient length of time (e.g., five (5) minutes) to dissolve BOX layer and wet release coiling arm. The HF acid typically dissolves the oxide starting at the edges of the coiling arm structure and laterally undercutting the coils as the oxide is removed. Once the oxide is dissolved, the device layers are free to coil towards the substrate, as discussed above.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated

The invention claimed is:

1. A system for fabricating nanocoils using a wet etch technique, comprising:
    a substrate;
    a coiling arm structure including: a buried oxide layer deposited on the substrate;
    a stressed coiling bi-layer attached to the buried oxide layer including:
        a silicon device layer that includes one or more devices defined thereon;
        and a stressed nitride layer that provides a tensile coiling stress; and
    a metal encapsulation layer that protects the stressed nitride layer from hydrofluoric (HF) acid used to release the coiling arm structure from the substrate during the wet etch technique so that coiling arm structure coils into nanocoil when released.

2. The system of claim 1 in which the substrate is a silicon substrate.

3. The system of claim 2 in which the silicon substrate is part of a silicon-on-insulator (SOI) wafer.

4. The system of claim 1 in which the buried oxide layer comprises $SiO_2$.

5. The system of claim 1 in which silicon device layer includes a memory device.

6. The system of claim 1 in which stressed nitride layer comprises $Si_3Ni_4$.

7. The system of claim 1 in which metal encapsulation layer comprises a Chromium/Gold (Cr/Au) bi-layer.

8. The system of claim 7 in which Cr/Au bi-layer comprises a 100 Å Cr layer and a 100 Å Au layer.

9. The system of claim 1 in which stressed nitride layer is situated on top of silicon device layer.

10. The system of claim 1 in which silicon device layer is situated on top of the stressed nitride layer.

* * * * *